(12) United States Patent
Kimura

(10) Patent No.: US 7,965,106 B2
(45) Date of Patent: *Jun. 21, 2011

(54) SEMICONDUCTOR DEVICE AND DRIVING METHOD THEREOF

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 683 days.

This patent is subject to a terminal disclaimer.

(21) Appl. No.: 11/970,045

(22) Filed: Jan. 7, 2008

(65) Prior Publication Data

US 2008/0277707 A1    Nov. 13, 2008

Related U.S. Application Data

(63) Continuation of application No. 10/701,611, filed on Nov. 6, 2003, now Pat. No. 7,327,168.

(30) Foreign Application Priority Data

Nov. 20, 2002    (JP) .................................. 2002-335918

(51) Int. Cl.
  *H03K 19/0175*    (2006.01)
(52) U.S. Cl. .......................................... 326/88; 326/63
(58) Field of Classification Search .............. 326/82–83, 326/86, 88, 112, 114, 119–122, 63; 327/390
See application file for complete search history.

(56) References Cited

U.S. PATENT DOCUMENTS

| | | |
|---|---|---|
| 4,758,801 A | 7/1988 | Draxelmayr |
| 4,797,579 A | 1/1989 | Lewis |
| 4,827,159 A | 5/1989 | Naganuma |
| 4,877,980 A | 10/1989 | Kubinec |
| 4,922,364 A | 5/1990 | Paulsson |
| 5,128,560 A | 7/1992 | Chern |
| 5,808,480 A | 9/1998 | Morris |
| 5,811,992 A | 9/1998 | D'Souza |
| 5,929,679 A | 7/1999 | Ohwada |
| 5,949,270 A | 9/1999 | Saito |
| 6,072,353 A | 6/2000 | Matsuzawa |
| 6,166,580 A | 12/2000 | Sessions |

(Continued)

FOREIGN PATENT DOCUMENTS

CN    1139317    1/1997

(Continued)

OTHER PUBLICATIONS

Y. Kubota et al., "Late-News Paper: Low-Voltage Interface Technology for CGS TFT-LCD with Low Power Consumption," SID 99 Digest, 1999, pp. 1116-1119.

(Continued)

*Primary Examiner* — James Cho
(74) *Attorney, Agent, or Firm* — Fish & Richardson P.C.

(57) ABSTRACT

It is an object of the invention to provide a digital circuit which can operate normally regardless of binary potentials of an input signal. A semiconductor device having a correcting unit and a logic unit wherein the correcting unit includes a capacitor, first and second switches, wherein the first electrode of the capacitor is connected to the input terminal and the second electrode of the capacitor is connected to the gate of the transistor in the logic circuit, wherein the first switch controls the connection between a gate and drain of the transistor and the second switch controls the potential to be supplied to the drain of the transistor is provided.

25 Claims, 22 Drawing Sheets

U.S. PATENT DOCUMENTS

| | | | |
|---|---|---|---|
| 6,211,720 B1 | 4/2001 | Matsuzawa | |
| 6,229,506 B1 * | 5/2001 | Dawson et al. | 345/82 |
| 6,236,576 B1 | 5/2001 | Munk-Nielsen | |
| 6,242,951 B1 | 6/2001 | Nakata | |
| 6,242,973 B1 | 6/2001 | Kong | |
| 6,483,679 B1 | 11/2002 | Anand | |
| 6,577,302 B2 | 6/2003 | Hunter | |
| 6,603,456 B1 | 8/2003 | Aoki et al. | |
| 6,628,146 B2 | 9/2003 | Tam | |
| 6,731,273 B2 | 5/2004 | Koyama | |
| 6,927,618 B2 | 8/2005 | Kimura | |
| 6,972,594 B2 | 12/2005 | Yu | |
| 7,090,387 B2 | 8/2006 | Kohno | |
| 2001/0028271 A1 | 10/2001 | Andre | |
| 2003/0117352 A1 | 6/2003 | Kimura | |
| 2003/0132931 A1 | 7/2003 | Kimura | |
| 2003/0174009 A1 | 9/2003 | Kimura | |
| 2004/0080474 A1 | 4/2004 | Kimura | |
| 2004/0085115 A1 | 5/2004 | Fujiyoshi | |
| 2004/0155698 A1 | 8/2004 | Kimura | |
| 2004/0257117 A1 | 12/2004 | Kimura | |
| 2005/0099068 A1 | 5/2005 | Kimura | |

FOREIGN PATENT DOCUMENTS

| | | |
|---|---|---|
| JP | 10003789 B | 1/1989 |
| JP | 09-172367 | 6/1997 |
| JP | 09-232938 | 9/1997 |
| JP | 10-003789 A | 1/1998 |
| JP | 10-149678 | 6/1998 |
| JP | 10-303732 | 11/1998 |
| JP | 2001125545 A | 5/2001 |

OTHER PUBLICATIONS

H. Washio et al., "TFT-LCDs with Monolithic Multi-Drivers for High Performance Video and Low-Power Text Modes," SID 01 Digest, 2001, pp. 276-279.

G. A. Cairns et al., "Multi-Format Digital Display with Content Driven Display Format," SID 01 Digest, 2001, pp. 102-105.

G. Cairns et al., "High Performance Circuitry for Poly-Silicon Integrated Drivers," EuroDisplay '99, Sep. 6-9, 1999, pp. 89-92.

International Search Report (Application No. PCT/JP03/16237), Apr. 13, 2004, 2 pages.

European Search Report (Application No. 04002477.0), Jun. 14, 2004, 4 pages.

Office Action (Application No. 200310116482.9, CN6739 dated Feb. 9, 2007).

* cited by examiner

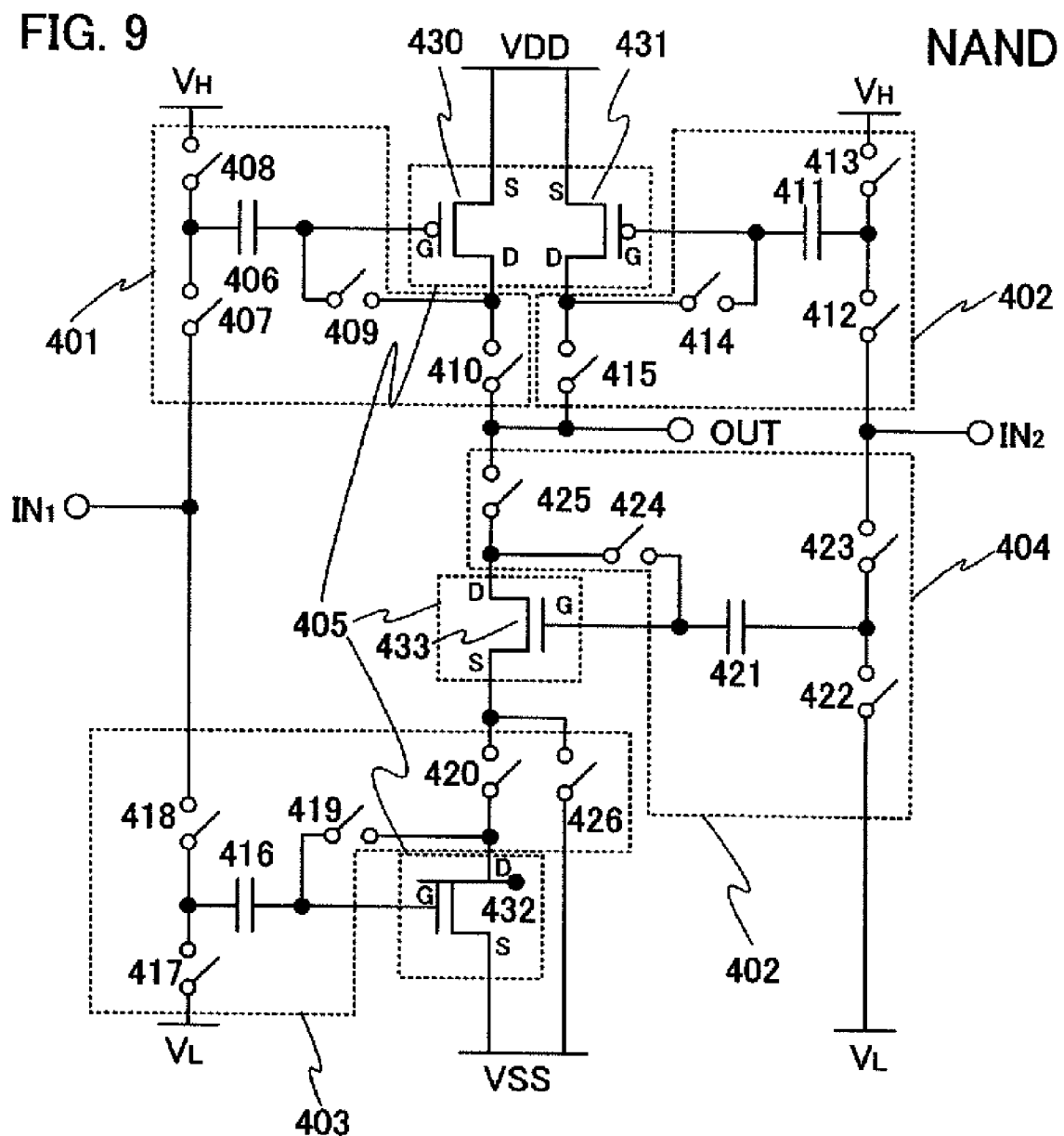
FIG. 9     NAND

NOR

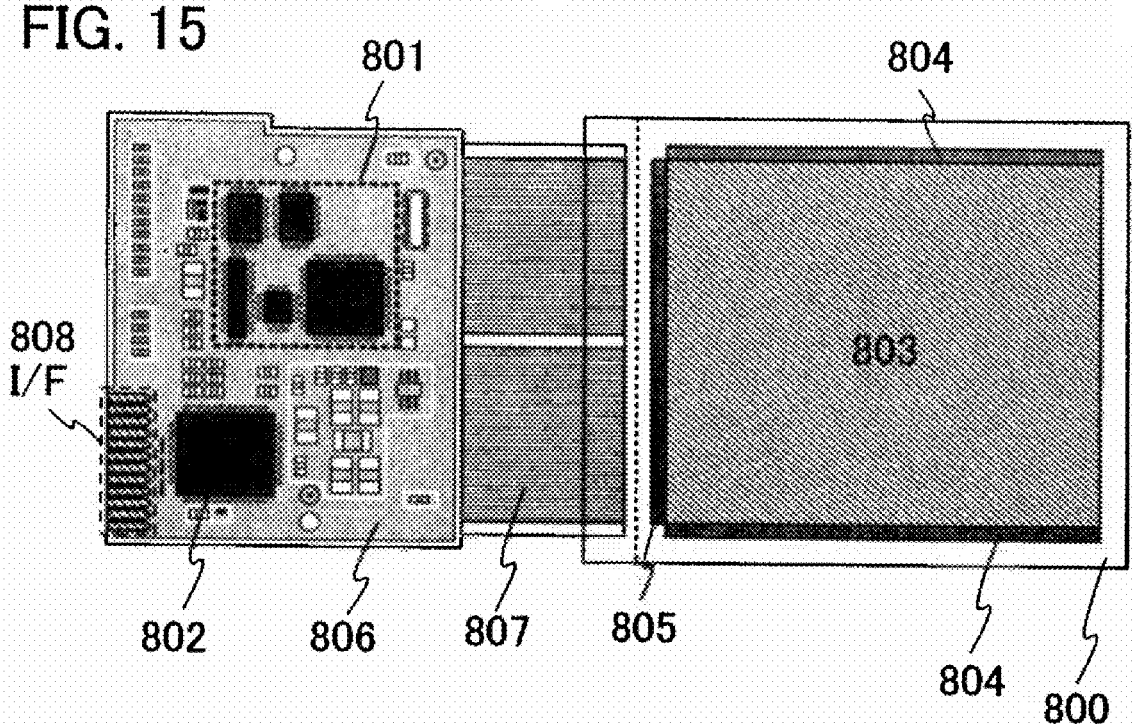

PRIOR ART
FIG. 16A
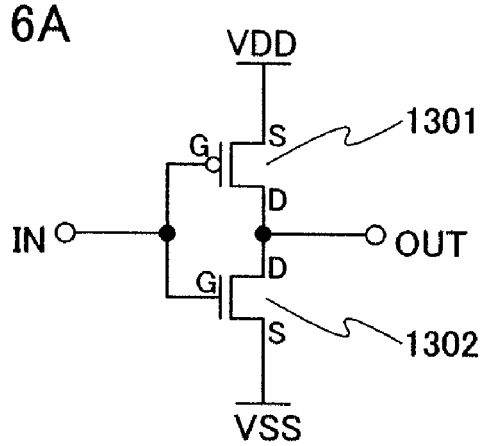
FIG. 16B (VDD'≧VDD)
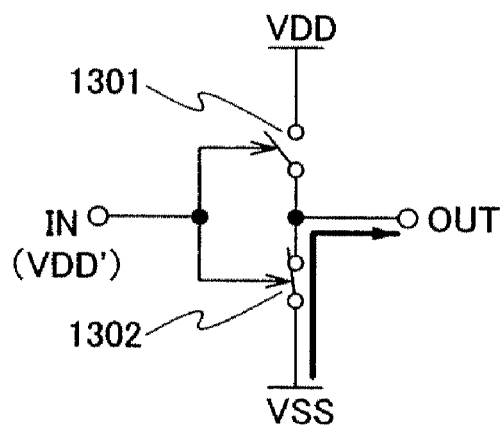
FIG. 16C (VSS'≦VSS)
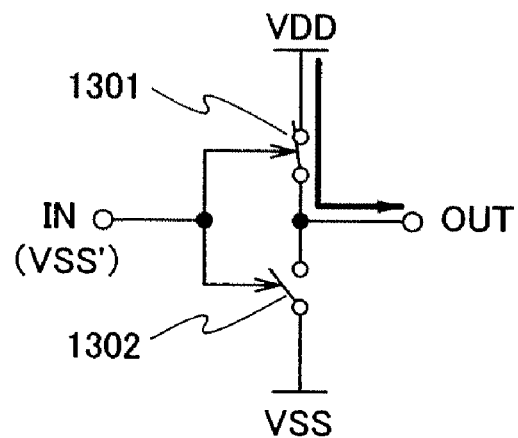

PRIOR ART
FIG. 17A  (VDD'<VDD)
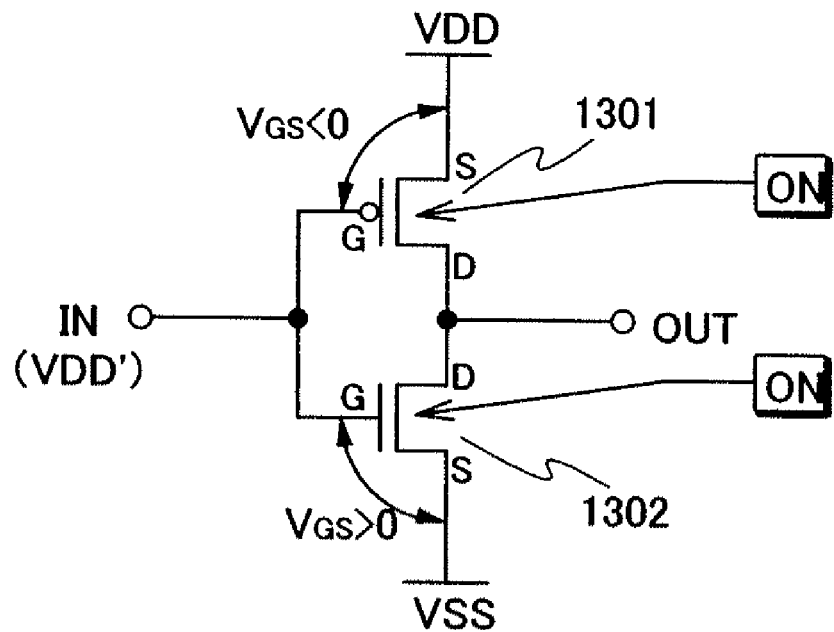
FIG. 17B  (VSS'>VSS)
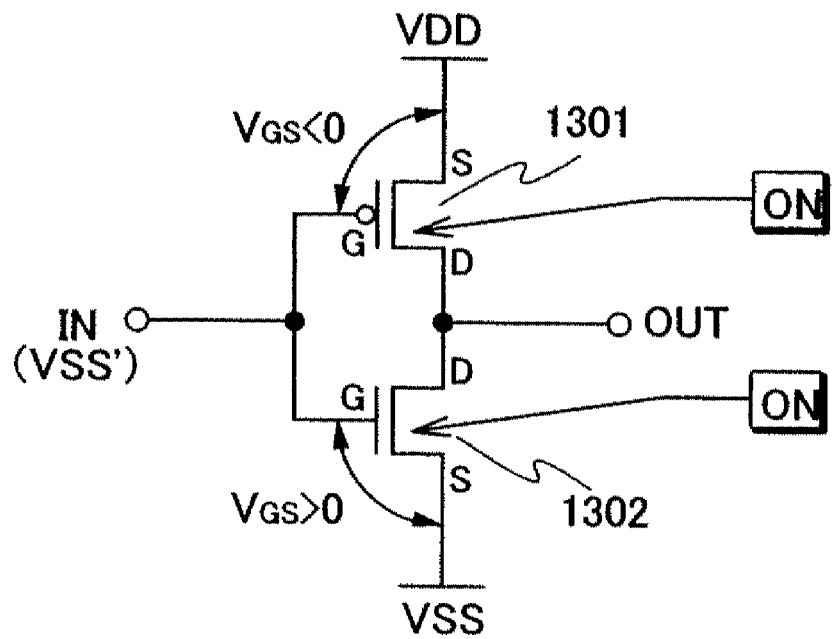

SEMICONDUCTOR DEVICE AND DRIVING METHOD THEREOF

BACKGROUND OF THE INVENTION

1. Field of the Invention

The present invention relates to a digital circuit which operates in synchronism with a digital signal, and more particularly to a semiconductor device having a single or a plurality of the digital circuits and a driving method thereof.

2. Description of the Related Art

A logic circuit processing a digital signal (hereinafter referred to as a digital circuit) is configured with a single or a plurality of logic elements as a basic unit. The logic element is a circuit which provides one output corresponding to a single or a plurality of inputs. Examples of the logic elements include an inverter, an AND, an OR, a NOT, a NAND, a NOR, a clocked inverter, and a transmission gate and the like.

The logic element is configured with a single or a plurality of circuit elements such as transistors, resistors and capacitor elements. By operating the plurality of circuit elements in accordance with a digital signal inputted to the logic element, a signal potential or a current which is to be supplied to a subsequent circuit is controlled. Note that, in this specification, connection means an electrical connection unless otherwise stated. Therefore, in the configurations of the invention, elements which enable the electrical connections (other elements or switches or the like) may be interposed among the predetermined connections additionally.

Given as an example herein is an inverter as one of the logic elements. A configuration and operation thereof are explained concretely below.

A circuit diagram of a general inverter is shown in FIG. 16A. In FIG. 16A, IN means an inputted signal (input signal), and OUT means an outputted signal (output signal). Meanwhile, VDD and VSS mean power source potentials and VDD is higher than VSS (VDD>VSS).

The inverter as shown in FIG. 16A includes a p-channel type TFT (Thin Film Transistor) 1301 and an n-channel type TFT 1302. A gate (G) of the p-channel type TFT 1301 and a gate of the n-channel type TFT 1302 are connected to each other, and the input signal IN is inputted to both gates. A first terminal of the p-channel type TFT 1301 receives VDD, and a first terminal of the n-channel type TFT 1302 receives VSS. Meanwhile, a second terminal of the p-channel type TFT 1301 and a second terminal of the n-channel type TFT 1302 are connected to each other and the output signal OUT is outputted from these second terminals to a subsequent circuit.

Note that, either of the first terminal or the second terminal corresponds to a source and the other corresponds to a drain. In the case of a p-channel type TFT, a terminal having a higher potential is a source and a terminal having a lower potential is a drain, and in the case of an n-channel type TFT, a terminal having a higher potential is a drain and a terminal having a lower potential is a source. Therefore, the first terminals of both TFTs correspond to sources (S) and the second terminals thereof correspond to drains (D) in FIG. 16A.

Generally, for an input signal, a digital signal having binary potentials is utilized. Two circuit elements of the inverter are operated in accordance with a potential of the input signal IN, thereby controlling a potential of the output signal OUT.

Next, an operation of the inverter as shown in FIG. 16A is explained with reference to FIGS. 16B and 16C. Note that in the FIGS. 16B and 16C, each circuit element is shown simply as a switch for clarification of the operating state.

FIG. 16B shows an operating state of each circuit element in the case where the input signal IN has a potential on the high potential side. Here, the potential on the high potential side of the input signal IN is referred to as VDD' (VDD'≧VDD), and it is assumed to simplify the explanation, that a threshold voltage of the n-channel type TFT 1302 ($V_{THn}$) is equal or higher than 0 ($V_{THn} \geq 0$) and a threshold voltage of the p-channel type TFT 1301 ($V_{THp}$) is equal or lower than 0 ($V_{THp} \leq 50$).

When the gate of the p-channel type TFT 1301 receives the potential VDD', a voltage between the gate and source (hereinafter referred to as a gate voltage) becomes $V_{GS} \geq 0$ because VDD'≧VDD and the p-channel type TFT 1301 is thus turned OFF. Note that the gate voltage corresponds to a voltage obtained by subtracting a source potential from a gate potential.

Meanwhile, when the gate of the n-channel type TFT 1302 receives the potential VDD' the gate voltage becomes $V_{GS} > 0$ because VDD'>VSS and the n-channel type TFT 1302 is thus turned ON. Therefore, the power source potential VSS is supplied to the subsequent circuit as a potential of the output signal OUT.

Next, an operating state of each circuit element in the case where the input signal IN has a potential on the low potential side is shown in FIG. 16C. Here, the potential on the low potential side of the input signal IN is referred to as VSS' (VSS'≦VSS) and it is assumed to simplify the explanation, that a threshold voltage of the n-channel type TFT 1302 ($V_{THn}$) is equal or higher than 0 ($V_{THn} \geq 0$) and a threshold voltage of the p-channel type TFT 1301 ($V_{THp}$) is equal or lower than 0 ($V_{THp} \leq 0$).

When the gate of the n-channel type TFT 1302 receives the potential VSS', the gate voltage becomes $V_{GS} \leq 0$ because VSS' is equal or lower than VSS (VSS'≦VSS) and the n-channel type TFT 1302 is thus turned OFF.

Meanwhile, when the gate of the p-channel type TFT 1301 receives the potential VSS', the gate voltage becomes $V_{GS}$ is lower than 0 ($V_{GS} < 0$) because VSS' is lower than VDD (VSS'<VDD) and the p-channel type TFT 1301 is thus turned ON. Therefore, the power source potential VDD is supplied to the subsequent circuit as a potential of the output signal OUT.

In this manner, each circuit element is operated in accordance with the potential of the input signal IN, thereby controlling the potential of the output signal OUT.

The operations of the inverter explained referring to FIGS. 16B and 16C are ones in the case where the binary potentials of the input signals IN (VDD' and VSS') are assumed to be VDD'≧VDD and VSS'≦VSS respectively. Hereinafter verified are operations of the inverter as shown in FIG. 16A in the case where it is assumed that VDD' is lower than VDD (VDD'<VDD) and VSS' is higher than VSS (VSS'>VSS). Note that VSS'<VDD' is established.

First, FIG. 17A shows an operating state of each circuit element in the case where the input signal IN has a potential on the high potential side VDD' (VDD'<VDD). Here, it is assumed to simplify the explanation, that a threshold voltage of the n-channel type TFT 1302 ($V_{THn}$) is equal or higher than 0 ($V_{THn} \geq 0$) and a threshold voltage of the p-channel type TFT 1301 ($V_{THp}$) is equal or lower than 0 ($V_{THp} \leq 0$).

When the gate of the p-channel type TFT 1301 receives the potential VDD', the gate voltage becomes $V_{GS} < 0$ because VDD'<VDD is established. Therefore, when $|V_{GS}| > |V_{THp}|$, the p-channel type TFT 1301 is turned ON. Meanwhile, when the gate of the n-channel type TFT 1302 receives the potential VDD', the gate voltage becomes $V_{GS} > 0$ because VDD' is higher than VSS (VDD'>VSS), thus the n-channel type TFT 1302 is turned ON.

Therefore, both p-channel type TFT 1301 and the n-channel type TFT 1302 are turned ON depending on the values of VDD, VDD' and $V_{THp}$. That is, unlike the case as shown in FIG. 16B, a potential of the output signal OUT does not become VSS even when an input signal IN has a potential on the high potential side.

A potential of the output signal OUT is determined by the current flowing in each transistor. In FIG. 17A, when $V_{GS}$ of the n-channel type transistor TFT 1302 is referred to as $V_{GSn}$ and $V_{GS}$ of the p-channel type TFT 1301 is referred to as $V_{GSp}$, $|V_{GSn}|$ is larger than $|V_{GSp}|$ ($|V_{GSn}|>|V_{GSp}|$). Therefore, the potential of the output signal OUT approaches closer to VSS than VDD when there is almost no difference between each transistor as to the characteristics and a ratio of a channel width W to a channel length L. However, the potential of the output signal OUT can approach closer to VDD than VSS depending on a mobility, a threshold voltage and the ratio of the channel width W to the channel length L of each TFT. In this case, the digital circuit does not operate normally, leading to a high possibility of malfunction. Further, it can cause a sequential malfunction in the subsequent digital circuit.

FIG. 17B shows an operating state of each circuit element in the case where the input signal IN has a potential on the low potential side VSS' (VSS'>VSS). It is assumed to simplify the explanation, that a threshold voltage of the n-channel type TFT 1302 ($V_{THn}$) is equal or higher than 0 ($V_{THn} \geqq 0$) and a threshold voltage of the p-channel type TFT 1301 ($V_{THp}$) is equal or lower than 0 ($V_{THp} \leqq 0$).

When the gate of the n-channel type TFT 1302 receives the potential VSS', the gate voltage becomes $V_{GS}<0$ because VSS' is higher than VSS (VSS'>VSS). Therefore, when $|V_{GS}|>|V_{THn}|$, the n-channel type TFT 1302 is turned ON. Meanwhile, when a gate of the p-channel type TFT 1301 receives the potential VSS', the gate voltage becomes $V_{GS}<0$ because VSS' is lower than VDD (VSS'<VDD), thus the p-channel type TFT 1301 is turned ON.

Therefore, the p-channel type TFT 1301 and the n-channel type TFT 1302 are both turned ON depending on the values of VSS, VSS' and $V_{THn}$. That means, unlike the case as shown in FIG. 16C, a potential of the output signal OUT does not become VDD even when an input signal IN has a potential on the low potential side.

A potential of the output signal OUT is determined by a current flowing in each transistor. In FIG. 17B, $|V_{GSn}|<|V_{GSp}|$. Therefore, the potential of the output signal OUT approaches closer to VDD than VSS when there is almost no difference between each transistor as to the characteristics and ratio of channel width W to channel length L. However, the potential of the output signal OUT can approach closer to VSS than VDD depending on the mobility, threshold voltage and ratio of the channel width W to the channel length L of each TFT. In this case, the digital circuit does not operate normally, leading to a high possibility of a malfunction. Further, it can cause a sequential malfunction at a subsequent digital circuit.

As described above, in the inverter as shown in FIG. 16A, an output signal OUT having a desired potential is obtained when the binary potentials VDD' and VSS' of the input signal IN are in the relations of VDD'≧VDD and VSS'≦VSS respectively, thereby a normal operation is obtained. However, when the binary potentials VDD' and VSS' of the input signal IN are in the relations of VDD'<VDD and VSS'>VSS respectively, the output signal OUT having a desired potential is not obtained, thereby the inverter may not operate normally.

The above case is not exclusively limited to the inverter, but can be applied to other digital circuits. That is, when the binary potential of the input signal IN is out of the predetermined range, the circuit elements of the digital circuit malfunction. Therefore, the output signal OUT having a desired potential can not be obtained and the digital circuit does not function normally.

A potential of the input signal supplied from a circuit or a wiring of a prior stage is not always an appropriate value for operating the digital circuit normally. In this case, by adjusting the potential of the input signal by a level shifter, the digital circuit can operate normally. However, a high-speed operation of the semiconductor device is frequently hindered by using the level shifter, because level shifters generally have disadvantages in that the speed of rising and dropping of the potential of the output signal is slow as each of the circuit elements operate in conjunction with such that one circuit element triggers the operations of other circuit elements.

It is also difficult to obtain a high-speed operation because TFTs are not readily turned ON when a power source voltage is low whereby current is also reduced. Meanwhile, the power consumption increases when a power source voltage is increased to obtain a high-speed operation.

Further, current consumption increases since the n-channel type TFT 1302 and the p-channel type TFT 1302 are simultaneously turned ON and a short-circuit current flows in the TFTs.

To solve the foregoing problems, it is suggested that in a level shifter circuit having a first input inverter and a second output inverter, a DC level of a signal inputted to the second inverter from the first inverter is converted by capacitors (capacitor elements) and a bias means (Reference to Patent Document 1). However, in this circuit, a DC level conversion capacitor is connected between a gate of each transistor configuring the second inverter and an output terminal of the first inverter connected to a High-level power source potential or a Low-level power source potential at all times by the bias means. Therefore, the charge and discharge of these capacitors have damaging influence on the dynamic characteristics of the circuit (namely, causes the decrease in operation speed of the circuit), or the power consumption with the charge and discharge of the capacitors is increased to a considerable extent. Meanwhile, when there are fluctuations in threshold voltages of the transistors, it is difficult to match electrostatic capacitance of each capacitor to the corresponding transistors. Therefore, voltages of both terminals of the DC level conversion capacitor do not match the threshold voltages of the corresponding transistors, thus ON/OFF operation of the transistors may not be performed normally.

[Patent Document 1] Japanese Patent Laid-Open No. Hei 09-172367

SUMMARY OF THE INVENTION

The present invention has been made in view of the above-described problems. It is an object of the invention to provide a digital circuit which can operate normally regardless of binary potentials of an input signal.

The inventor considered that a digital circuit could be operated normally by storing in advance a difference between a potential of a signal which is actually inputted to the digital circuit and a potential which is required to operate the digital circuit normally, and providing a correcting unit in the digital circuit which adds the potential difference to the potential of the signal which is actually inputted to the digital circuit in order to provide the corrected potential to circuit elements.

By using the correcting unit, an n-channel type transistor can be turned OFF when a potential on the low potential side of the input signal is supplied, and a p-channel type transistor can be turned OFF when a potential on the high potential side of the input signal is supplied. Therefore, the digital circuit can operate normally.

Shown in FIG. 1A is the configuration of the digital circuit of the invention. A digital circuit 100 includes a correcting unit 101 which corrects a potential of an input signal IN, and a single or a plurality of circuit elements 102 of which operations are controlled according to the input signal corrected by the correcting unit 101. A potential of an output signal OUT is controlled according to an operation of the circuit element.

Shown in FIG. 1B is a simple view showing a first configuration of the correcting unit 101 of the digital circuit of the invention. The correcting unit 101 of the first configuration includes a capacitor element 123 for correcting either potential on the high potential side or the low potential side of an input signal.

Also, the correcting unit 101 includes a switch 130 for controlling the supply of a power source potential 1 for a first electrode of the capacitor element 123 and a switch 131 for controlling the supply of a potential of the input signal IN for the first electrode of the capacitor element 123. Meanwhile, a switch 132 for controlling the connection between a gate and a drain of a transistor 140 of which the gate is connected to a second electrode of the capacitor element 123 among the transistors in the circuit element is provided. Further, a switch 133 for controlling the potential supply to the drain of the transistor 140 is provided. Note that, a voltage between the source and drain of the transistor 140 is referred to as $V_{DS}$. The potential supplied to the drain has to satisfy $|V_{DS}| \geq |V_{THp}|$ when, to put it concretely, the gate and the drain of the transistor 140 are connected to each other.

It is to be noted in FIG. 1B that a p-channel type transistor is applied to the transistor 140, but an n-channel type transistor may be applied as well. The latter case is shown in FIG. 1D.

Note that, when correcting a potential on the high potential side of the input signal IN, namely in the case as shown in FIG. 1B, the potential on the high potential side of the input signal IN is lower than that of the power source potential 2. Therefore, the power source potential 1<the power source potential 2 is established. Meanwhile, when correcting a potential on the low potential side of the input signal IN, namely in the case as shown in FIG. 1D, the potential on the low potential side of the input signal IN is lower than that of the power source potential 1. Therefore, the power source potential 1>the power source potential 2 is established.

Meanwhile, when correcting the potential on the high potential side of the input signal IN, namely in the case as shown in FIG. 1B, it is desirable that the power source potential 1 is set in the vicinity of the potential on the high potential side of the input signal IN, or more preferably, lower. By above operation, the p-channel type TFT 140 can be easily turned OFF when the potential on the high potential side of the input signal IN is supplied. Meanwhile, when correcting the potential on the low potential side of the input signal IN, namely in the case as shown in FIG. 1D, it is desirable that the power source potential 1 is set in the vicinity of the potential on the low potential side of the input signal IN, or more preferably, higher. When the transistor 140 is n-channel type, it can easily be turned OFF by above operation when the potential on the low potential side of the input signal IN is supplied.

Furthermore, by controlling the switches 130 to 133, a potential difference in which a threshold voltage $V_{TH}$ of the transistor 140 is added to the potential difference between the power source potential 1 and the power source potential 2 can be stored and held in the capacitor element 123.

By controlling the switch 131, a potential in which the potential difference held in the capacitor element 123 is added to the input signal IN is inputted to the gate of the transistor 140 when the first electrode of the capacitor element 123 receives the potential of the input signal IN.

Therefore, normal operations of the transistor 140, and further of the digital circuit 100 can be obtained. That is, the transistor 140 can be easily turned OFF when a potential on the high potential side of the input signal IN is added thereto. Meanwhile, when a potential on the low potential side of the input signal IN is added to the transistor 140, $|V_{GS}|$ is increased and thus easily turned ON. Similarly, when the transistor 140 is n-channel type, it can be easily turned OFF when a potential on the low potential side of the input signal IN is added thereto. Meanwhile, when a potential on the high potential side of the input signal IN is added to the transistor 140, $|V_{GS}|$ is increased and thus easily turned ON.

Normal operation means an operation in the case where a potential of the output terminal for an input signal IN on the low potential side is almost equivalent to a potential of the output terminal in the case where an input signal IN is equivalent to VSS. Also, normal operation means the operation in the case where a potential of the output terminal for an input signal IN is on the high potential side is almost equivalent to a potential of the output terminal in the case where an input signal IN is equivalent to VDD. Note that, an operation can be considered as normal unless a subsequent digital circuit malfunctions.

Note that, when there is already a switch which can control the potential supply to the drain of the transistor 140, the switch may be used as a substitute for the switch 133. In this case, the switch 133 does not need to be provided additionally. The same can be applied to FIG. 1D.

Shown in FIG. 1C is a simplified schematic diagram showing a second configuration of the correcting unit 101 of the digital circuit of the invention. The correcting unit 101 of the second configuration is a unit which performs a correcting operation using a potential of the input signal in place of the power source potential 1 as shown in FIG. 1B. Specifically, the correcting unit 101 of the second configuration includes a capacitor element 103 for correcting a potential of an input signal IN and a switch 105 for controlling the connection between the gate and drain of a transistor 104 of which gate is connected to a second electrode of the capacitor element 103 among the transistors in the circuit element. Further, a switch 106 for controlling the potential supply to the drain of the transistor 104 is provided. Note that, a potential supplied to the drain has to satisfy $|V_{DS}| \geq |V_{THp}|$ when, to put it concretely, the gate and drain of the transistor 104 are connected to each other.

Note that, in FIG. 1C, a p-channel type transistor is applied to the transistor 104, however, an n-channel type transistor can be applied instead. The latter case is shown in FIG. 1E.

Note also that, in the case of correcting a potential on the high potential side of the input signal IN, namely in the case as shown in FIG. 1C, the potential on the high potential side of the input signal IN is to be lower than that of the power source potential. Meanwhile, in the case of correcting a potential on the low potential side of the input signal IN, namely in the case as shown in FIG. 1E, the potential on the low potential side of the input signal IN is to be higher than that of the power source potential.

By controlling the switches 105 and 106, a potential difference in which a threshold voltage $V_{TH}$ of the transistor 104 is added to the potential difference between the input signal IN and the power source potential can be stored and held in the capacitor element 103.

When the first electrode of the capacitor element 103 receives the potential of the input signal IN, a potential in which the potential difference held in the capacitor element 103 is added to the input signal IN is inputted to the gate of the transistor 104.

Therefore, normal operations of the transistor 104, and further of the digital circuit 100 can be obtained.

By combining the first configuration and the second configuration of the invention, various digital circuits can be configured.

Meanwhile, in each of the first and the second configurations, there may be two switches to control the potential supply to the drains of the transistors. That is, an additional switch for controlling the potential supply to the drain of the transistor through a different path from that of the first switch may be provided. Given as an example is the case of providing an additional switch which can control the potential supply to the drain of the transistor through a different path from that of the first switch 106 in the second configuration. In this case, the charge of the capacitor element 103 may be initialized by controlling the drain potential of the transistor 104 with the additional switch, not with the switch 106. Therefore, when, for example, both the n-channel type transistor and the p-channel type transistor of the inverter are to be corrected, the capacitor elements corresponding to both transistors can be initialized at the same time. Also, the correction can be carried out by additionally providing a switch for controlling the potential supply to the drain even when a potential on the high potential side of the input signal IN is the same potential as the power source potential, and vice versa, the correction can be carried out by additionally providing the above switch even when a potential on the low potential side of the input signal IN is the same potential as the power source potential.

Note that, in each of the first and the second configuration, when there is already a switch which can control the potential supply to the drain of the transistor 104, the switch may be used a substitute for the switch 106. In this case, the switch 106 does not need to be provided additionally.

Meanwhile, the invention provides a condition where the gate capacitors of the transistors 140 and 104 are respectively connected in series with the capacitor elements 123 and 103 holding threshold voltages. Therefore, the resultant capacitance obtained by the serial connection between the gate capacitor of the transistor and the capacitor element holding the threshold voltage is to be smaller than the capacitance obtained by the single gate capacitor of the transistor. Accordingly, the delayed operation of the transistor due to the gate capacitor can be prevented, leading to a high-speed operation. Further, the malfunction of the transistor as one of the circuit elements such that it is turned ON whereas it should be turned OFF can be prevented, thereby an increase in power consumption due to the leak current can be prevented.

Note that, the initialization of the charges held in the capacitor elements and the storing operation of the potential difference that is to be corrected are preferably conducted again before the normal operation of the digital circuit is disturbed due to the leak of the current held in each of the capacitor elements.

In the case where a power source voltage is low, when the transistor is to be turned OFF, it is narrowly turned OFF so that $|V_{GS}|$ is equal to $|V_{TH}|$ ($|V_{GS}|=|V_{TH}|$). On the other hand, when the transistor is to be turned ON, $V_{GS}$ is set to be high so that $V_{GS}=V_{TH}+(V_H-V_L)$ is satisfied. As a result, the transistor is easily turned ON.

Note that, generally, n-channel type transistors have plus threshold voltages and p-channel type transistors have minus threshold voltages, however, transistors having $V_{THn}<0$ and $V_{THp}>0$ are also applicable to the invention.

Note that, the source and the drain of the transistor may be connected so that the gate capacitor of the transistor can be used as a capacitor element of the correcting unit. Meanwhile, a plurality of transistors for using as the capacitor elements may be provided in order to use as one capacitor element by connecting in parallel. In this case, either the n-channel type transistor or the p-channel type transistor may be applied, or both may be used as well. Note that, in determining which of the source/drain and gate of the transistor is to be used as which terminal of the capacitor element, the value of the potential provided to both terminals may be referred.

Meanwhile, amplitude of the input signal IN may be set small according to the configurations of the invention. Therefore, an additional boosting circuit may not necessarily be provided, thus makes a contribution to the reduction in cost. Also, when a signal from an IC is supplied as an input signal to a digital circuit formed over a glass substrate, the input signal may directly be supplied to the digital circuit without using the boosting circuit.

Note that, a switch used in the invention may be any switch such as an electrical switch or a mechanical switch. It may be anything as far as it can control a current. It may be a transistor, a diode, or a logic circuit configured with them. Therefore, in the case of applying a transistor as a switch, a polarity thereof (conductivity) is not particularly limited because it operates just as a switch. However, when OFF current is preferred to be small, a transistor of a polarity with small OFF current is favorably used. For example, the transistor which provides an LDD region has small OFF current. Further, it is desirable that an n-channel type transistor is employed when a potential of a source terminal of the transistor as a switch is closer to the power source potential on the low potential side (VSS), and a p-channel type transistor is employed when the potential of the source terminal is closer to the power source potential on the high potential side (VDD). This helps the switch operate efficiently as the absolute value of the voltage between a gate and drain of the transistor can be increased. It is also to be noted that a CMOS type switch can be applied by using both n-channel type and p-channel type transistors.

Note also that, when the digital circuit is a clocked inverter, the correcting unit may be provided at any transistors configuring the clocked inverter. Also, when the digital circuit is an inverter, it can be either a CMOS inverter using a bipolar transistor or an inverter using a transistor of one polarity and a resistor. Incidentally, a transistor of diode connection may also be used as a resistor.

According to the above configurations of the invention, a digital circuit can be operated normally regardless of the potential of an input signal.

Meanwhile, when a circuit element includes a transistor and the corrected input signal is inputted to the gate of the transistor, a gate capacitor of the transistor is connected in series with a first capacitor element or a second capacitor element. Therefore, the resultant capacitance obtained by the serial connection between the gate capacitor of the transistor and the first capacitor element or the second capacitor element is to be smaller than the capacitance obtained by the single gate capacitor of the transistor. Accordingly, the delayed operation of the transistor due to the gate capacitor can be prevented.

BRIEF DESCRIPTION OF THE DRAWINGS

FIG. 9 is a diagram showing the first configuration of a NAND which is one of the digital circuits of the invention;

FIG. 15 is an outline view of the semiconductor display device of the invention.

FIGS. 16A, 16B, and 16C are diagrams showing the configurations and operations of general inverters;

FIGS. 17A and 17B are diagrams showing the states of malfunctions of the inverters when the potential of the input signal is not the desired value;

DESCRIPTION OF THE PREFERRED EMBODIMENTS

Preferred embodiments of the invention will be hereinafter described referring to the accompanying drawings.

Embodiment Mode 1

In this embodiment mode, a specific configuration and an operation of an inverter as an example of the digital circuits of the invention are described.

Figure 2:
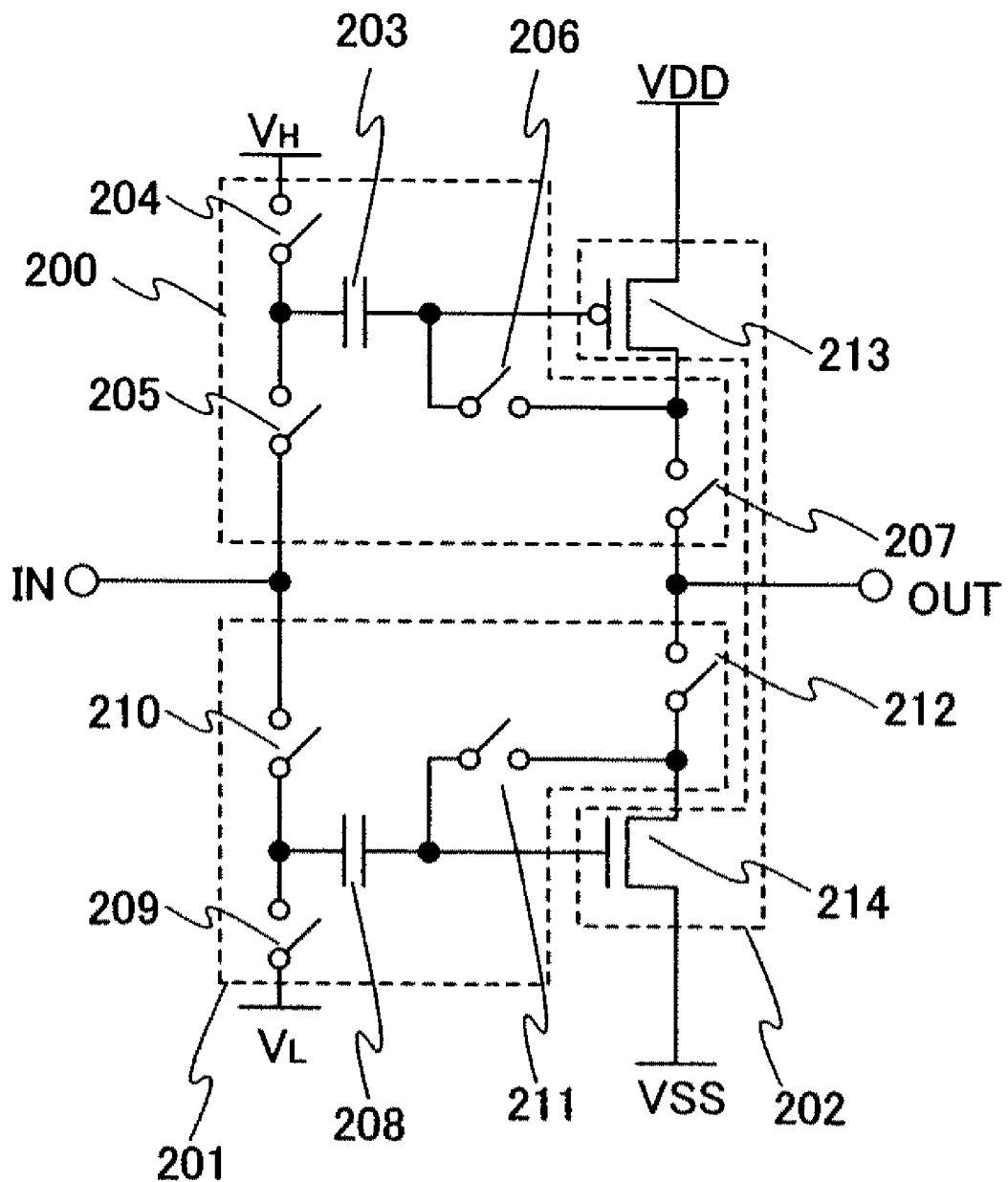
FIG. 2 is a diagram showing the first configuration of an inverter which is one of the digital circuits of the invention.

FIG. 2 shows a configuration of an inverter of this embodiment mode. Reference numerals 200 and 201 denote correcting units and reference numeral 202 denotes a circuit element group.

The correcting unit 200 includes a first capacitor element 203 and 4 switches 204 to 207 for controlling a potential supply to the first capacitor element 203. Meanwhile, the correcting unit 201 includes a second capacitor element 208 and 4 switches 209 to 212 for controlling the potential supply to the second capacitor element 208.

The switch 205 controls a supply of a potential of an input signal to a first electrode of the first capacitor element 203. The switch 204 controls a supply of a power source potential on the high potential side $V_H$ to the first electrode of the first capacitor element 203. The switch 206 controls a connection between a gate and a source of a p-channel type transistor 213 of which the gate is connected to a second electrode of the first capacitor element 203 among the transistors in the circuit element group 202. The switch 207 controls the potential supply to the drain of the p-channel type transistor 213.

Meanwhile, the switch 210 controls a supply of a potential of an input signal for a first electrode of the second capacitor element 208. The switch 209 controls the supply of a power source potential on the low potential side $V_L$ to the first electrode of the second capacitor element 208. The switch 211 controls a connection between a gate and a source of an n-channel type transistor 214 of which the gate is connected to a second electrode of the second capacitor element 208 among the transistors in the circuit element group 202. The switch 212 controls a potential supply to the drain of the n-channel type transistor 214.

The circuit element group 202 includes one p-channel type transistor 213 and one n-channel type transistor 214. Here, in the case where a transistor is a TFT is described as an example. A first terminal (the source here) of the p-channel type TFT 213 receives a power source potential VDD. Meanwhile, a first terminal (the source here) of the p-channel type TFT 214 receives a power source potential VSS.

Meanwhile, a second terminal (the drain here) of the p-channel type transistor 213 and a second terminal (the drain here) of the n-channel type transistor 214 are each connected so that a subsequent circuit can receive the potential as an output signal OUT when the switches 207 and 212 are ON.

The second electrode of the first capacitor element 203 is connected to the gate of the p-channel type transistor 213, and the second electrode of the second capacitor element 208 is connected to the gate of the n-channel type transistor 214.

Note that, VDD is higher than VSS (VDD>VSS) and $V_H$ is higher than $V_L$ ($V_H > V_L$). Also, VDD is higher than $V_H$ (VDD>$V_H$) and $V_L$ is higher than VSS ($V_L$>VSS). It is desirable that the power source potential $V_H$ is set lower than a potential on the low potential side of an input signal IN. However, when the input signal IN is a potential on the low potential side, the inverter is not to operate unless the transistor 213 is not ON. Therefore, it is desirable that the power source potential $V_H$ is set higher than the potential which turns ON the transistor 213 when the input signal IN is a potential on the low potential side, and lower than the potential on the high potential side of the input signal IN.

Meanwhile, it is desirable that the power source potential $V_L$ is set so that it may be higher than a potential on the low potential side of the input signal IN. However, when the input signal IN is a potential on the high potential side, the inverter does not operate unless the transistor 214 is ON. Therefore, it is desirable that the power source potential $V_L$ is set lower than the potential which turns ON the transistor 214 when the input signal IN is a potential on the high potential side, and higher than the potential on the low potential side of the input signal IN. In this embodiment mode, it is assumed to simplify the explanation, that the potential on the high potential side of the input signal IN is equal to the power source potential $V_H$ and the potential on the low potential side of the input signal IN is equal to the power source potential $V_L$.

Next, an explanation will be given on operations of the inverter as shown in FIG. 2 with reference to FIG. 3. Note that, the operations of the digital circuit of the invention are distinguished as follows: an operation to initialize charges held in the capacitor elements, an operation to store a potential difference which is to be corrected, and a normal operation as a primary function of the digital circuit.

Figure 3A:
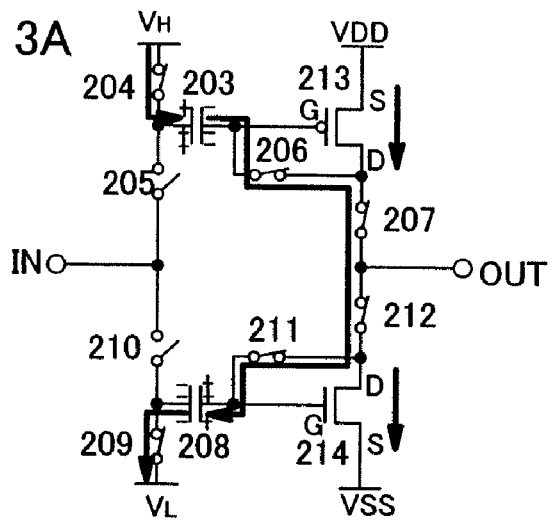
FIGS. 3A, 3B, and 3C are diagrams showing the operations of the inverter shown in FIG. 2.

First, the operation to initialize the charges held in each capacitor element is explained with reference to FIG. 3. Specifically, the switches 205 and 210 are turned OFF and the switches 204, 206, 207, 209, 211 and 212 are turned ON as shown in FIG. 3A. Next, the power source potential $V_H$ is supplied to a first electrode of the first capacitor element 203, the power source potential $V_L$ is supplied to a the first electrode of the second capacitor element 208, and the first electrode of the first capacitor element 203 is electrically connected to the second electrode of the second capacitor element 208. By above operation, the charges are stored in the first capacitor element 203 and the second capacitor element 208 by the power source potential $V_L$ and the power source potential $V_H$ respectively.

As for the p-channel type TFT 213 at this time, $V_{GS}$ is lower than $V_{THp}$ ($V_{GS} < V_{THp}$) and it is turned ON. Meanwhile, as for the n-channel type TFT 214, $V_{GS}$ is lower than $V_{THn}$ ($V_{GS} < V_{THn}$) and it is turned ON. Note that, connection may vary as long as the switches 207 and 212 are connected so that the transistors 213 and 214 can be turned ON. Further, additional switches may also be applied.

Figure 3B:
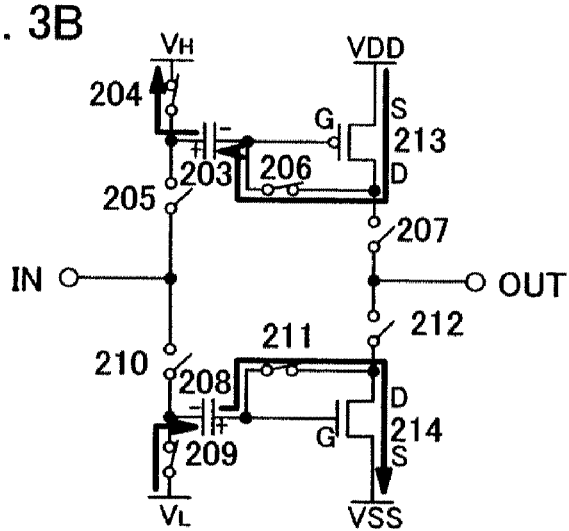

Next, as shown in FIG. 3B, the switches 205, 207, 210 and 212 are turned OFF and the switches 204, 206, 209 and 211 are turned ON. Right after turning OFF the switches 207 and 212, the p-channel type TFT 213 and the n-channel type TFT 214 are both ON, and VDD is higher than $V_H$ (VDD>$V_H$) and VSS is lower than $V_L$ (VSS<$V_L$). Therefore, drain current flows in the p-channel type TFT 213 and the n-channel type TFT 214. However, by this drain current, the charges stored in the first capacitor element 203 and the second capacitor element 208 respectively are released, and $V_{GS}$ of each element approaches $V_{TH}$ gradually. Eventually, drain current flowing in the p-channel type TFT 213 and the n-channel type TFT 214 becomes 0 when $V_{GS}$ becomes almost equivalent to $V_{TH}$. Note that, the switches 207 and 212 may be connected in a different way as long as the drains of the transistors 213 and 214 are only connected to the gates as described above. Meanwhile, in storing the potential difference which is to be corrected in the capacitor elements, the charges in the capacitor elements of the correcting unit do not have to be released until the drain current of the TFTs (the p-channel type TFT 213 and the n-channel type TFT 214 here) which are to be corrected becomes exactly 0. It operates satisfactorily when it is close to 0.

Furthermore, the first capacitor element 203 holds a potential difference between a potential in which the threshold voltage $V_{THp}$ of the p-channel type TFT 213 is added to the power source potential VDD and the power source potential $V_H$ (referred to as $Vc_1$). Meanwhile, the second capacitor element 208 holds a potential difference between a potential in which the threshold voltage $V_{THp}$ of the n-channel type TFT 214 is added to the power source potential VSS and the power source potential $V_L$ (referred to as $Vc_2$).

Figure 3C:
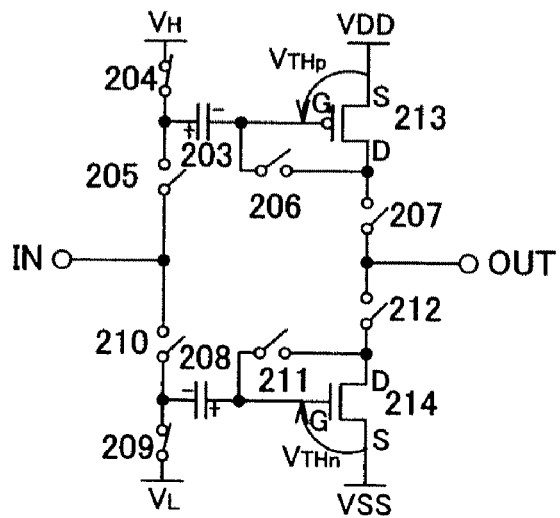

Next, by turning ON the switches 204 and 209 and turning OFF the switches 205, 206, 207, 210, 211 and 212 as shown in FIG. 3C, the charges accumulated in the first capacitor element 203 and the second capacitor element 208 are held, thereby the potential differences $Vc_1$ and $Vc_2$ are stored.

Next, an explanation will be given on a normal operation which is performed based on a correction on the potential of an input signal IN by the stored potential difference and the corrected potential.

Figure 4A:
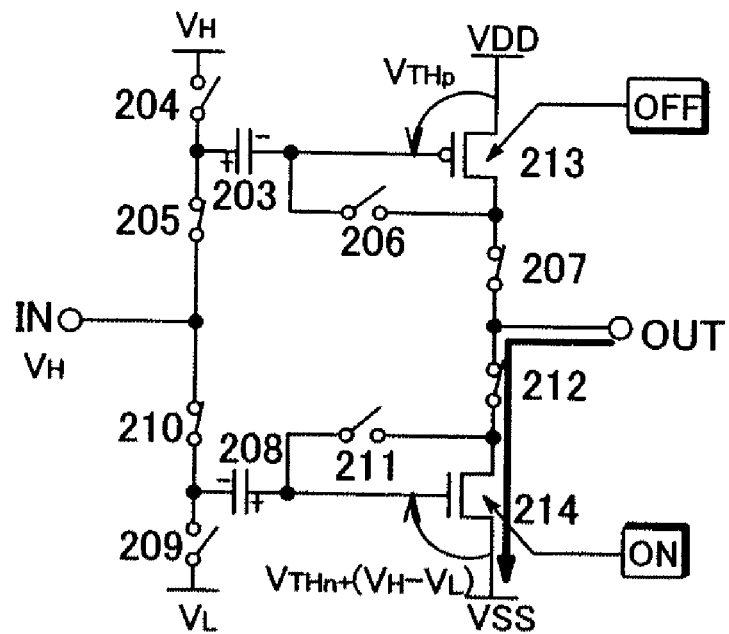
FIGS. 4A and 4B are diagrams showing the operations of the inverter shown in FIG. 2.

Next, an explanation will be given on an operation in the case where a potential of an input signal IN is on the high potential side ($V_H$ in this embodiment mode) with reference to FIG. 4A.

In the normal operation, the switches 205, 207, 210 and 212 are ON at all times and the switches 204, 206, 209 and 211 are OFF at all times. The potential of the input signal $V_H$ is supplied to the first electrode of the first capacitor element 203 via the switch 205 and for the first electrode of the second capacitor element 208 via the switch 210.

The potential difference between the two electrodes of the first capacitor element 203 and the potential difference between the two electrodes of the second capacitor element 208 are unchanged as $Vc_1$ and $Vc_2$ respectively following the law of conservation of charge. Therefore, the potential of the second electrode of the first capacitor element 203 is kept at a potential in which the potential difference $Vc_1$ is added to the potential $V_H$ when the first electrode thereof receives the potential $V_H$. The potential difference at this time is $Vc_1$=VDD+$V_{THn}$−$V_H$, which means the potential of the second electrode of the first capacitor element 203 is VDD+$V_{THp}$. Therefore, the gate of the p-channel type transistor 213 receives the potential of the second electrode VDD+$V_{THp}$, thus the p-channel type transistor 213 is turned OFF On the other hand, the potential of the second electrode of the second capacitor element 208 is kept at the potential of the addition of the potential $V_H$ and the potential difference $Vc_2$ when the first electrode thereof receives the potential $V_H$. The potential difference at this time is $Vc_2$=VSS+$V_{THn}$−$V_L$, which means the potential of the second electrode of the second capacitor element 208 is $V_H$+VSS+$V_{THn}$−$V_L$. Therefore, the gate voltage of the n-channel type transistor 214 is $V_{GS}$=$V_H$+$V_{THn}$−$V_L$. Now $V_H$>$V_L$, so $V_{GSn}$−$V_{THn}$=$V_H$−$V_L$>0, thus the n-channel type transistor 214 is turned ON.

Therefore, when the potential of the input signal IN is $V_H$, the power source potential VSS is supplied to the subsequent circuit as a potential of an output signal OUT.

Figure 4B:
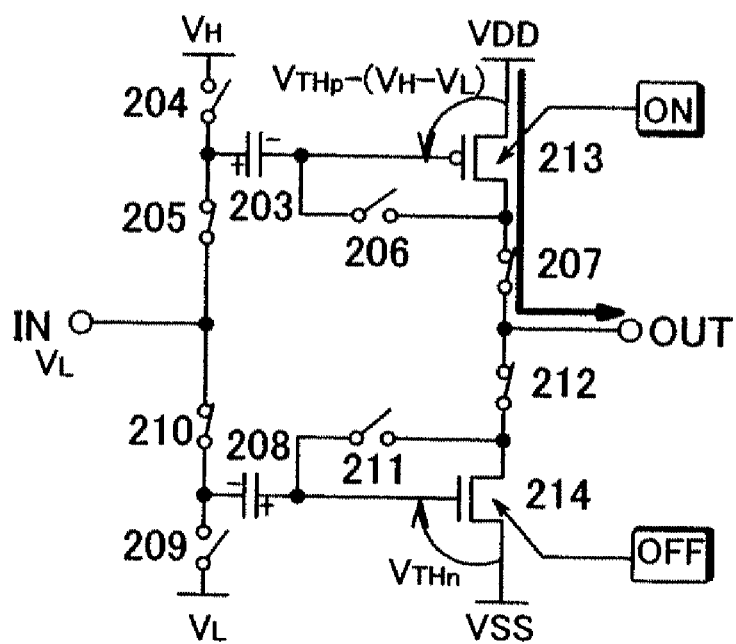

Next, an explanation will be given on an operation in the case where a potential of an input signal IN is on the low potential side ($V_L$ in this embodiment mode) with reference to FIG. 4B.

As described above, in the normal operation, the switches 205, 207, 210 and 212 are ON at all times and the switches 204, 206, 209 and 211 are OFF at all times. The potential of the input signal $V_L$ is supplied to the first electrode of the first capacitor element 203 via the switch 205 and to the first electrode of the second capacitor element 208 via the switch 210.

The potential difference between the two electrodes of the first capacitor element 203 and the potential difference between the two electrodes of the second capacitor element 208 are unchanged as $Vc_1$ and $Vc_2$ respectively following the law of conservation of charge. Therefore, the potential of the second electrode of the first capacitor element 203 is kept at a potential in which the potential difference $Vc_1$ is added to the potential $V_L$ when the first electrode thereof receives the potential $V_L$. The potential difference at this time establishes $Vc_1$=VDD+$V_{THp}$−$V_H$, which means the potential of the second electrode of the first capacitor element 203 is $V_L$+VDD+$V_{THp}$−$V_H$. Therefore, the gate voltage of the p-channel type transistor 213 is $V_{GS}$=$V_L$+$V_{THp}$−$V_H$. Now $V_H$>$V_L$, so $V_{GSp}$−$V_{THp}$=$V_H$−$V_L$<0, thus the p-channel type transistor 213 is turned ON.

On the other hand, the potential of the second electrode of the second capacitor element 208 is kept at the potential of the addition of the potential $V_L$ and the potential difference $Vc_2$ when the first electrode thereof receives the potential $V_L$. The potential difference at this time establishes $V_{c2}=VSS+V_{THn}-V_L$, which means the potential of the second electrode of the second capacitor element 208 is $VSS+V_{THn}$. The gate of the n-channel type transistor 214 receives the potential of the second electrode $VSS+V_{THn}$, and the gate voltage of the n-channel type transistor 214 is $V_{GS}=V_{THn}$, thus the n-channel type transistor 214 is turned OFF.

Therefore, when the potential of the input signal IN is $V_L$, the power source potential VDD is supplied to the subsequent circuit as a potential of an output signal OUT.

With the configurations described above, the invention can provide a digital circuit which operates normally regardless of a potential of an input signal.

It is to be noted that in this embodiment mode, the supply of the power source potential $V_H$ or $V_L$ to the first electrode of each capacitor element 203 and 208 is controlled by the switch 204 or 209, however, the invention is not exclusively limited to this configuration. The supply of a power source potential $V_H'$ which is different from the power source potential $V_H$ to the first electrode of the first capacitor element 203 may be controlled by the switch 204 as well. Also, the supply of the power source potential $V_L'$ which is different from the power source potential $V_L$ to the first electrode of the second capacitor element 208 may be controlled by the switch 209. In this case, when the potential on the high potential side of the input signal IN is referred to as $V_H$ and the potential on the low potential side thereof is referred to as $V_L$, $V_L$ is lower than $V_H'$ ($V_L < V_H'$) and $V_H$ is higher than $V_L'$ ($V_H > V_L'$). Further, it is desirable that relations are $V_H' \geq V_H$ and $V_L' \leq V_L$.

There may be two switches to control the potential supply to the drains of the transistors 213 and 214. That is, an additional switch for controlling the potential supply to the drains of the transistors through a different path from those of the first switches 207 and 212 may be provided.

Note that, in this embodiment mode, the operation to initialize the charge and the operation to store the potential difference which is to be corrected may be carried out simultaneously in the first capacitor element 203 and the second capacitor element 208 regardless of the potential of the input signal IN.

Figure 18A:
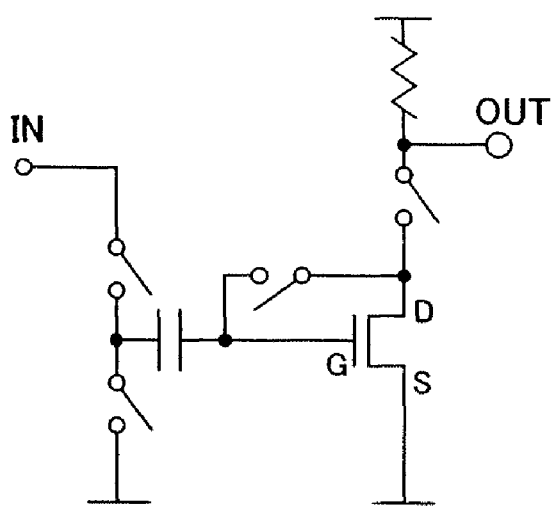
FIG. 18A is a diagram showing a configuration of an inverter having a resistor and FIG. 18B is a diagram showing a configuration of the inverter having a transistor of diode connection.
Figure 18B:
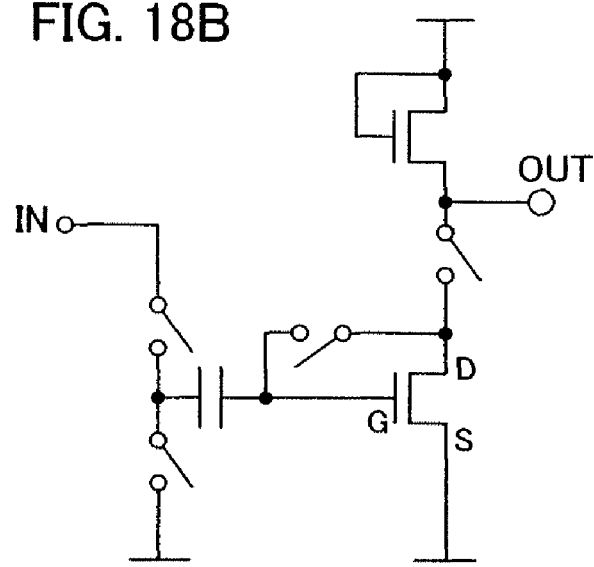

Note that a CMOS type inverter is shown in FIG. 2, however, the invention can be easily applied to an inverter using a resistor or a diode-connected transistor as shown in FIGS. 18A and 18B.

Embodiment Mode 2

Figure 1A:
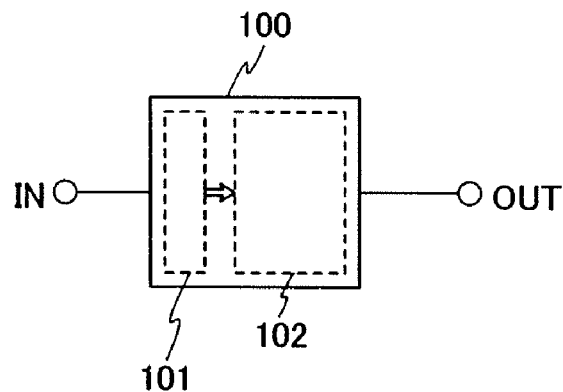
FIGS. 1A, 1B, 1C, 1D, and 1E are diagrams showing the configurations of a digital circuit of the invention.
Figure 1B:
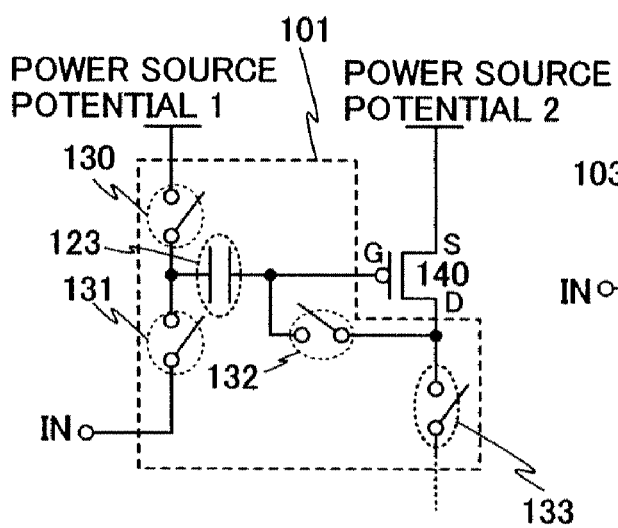
Figure 1C:
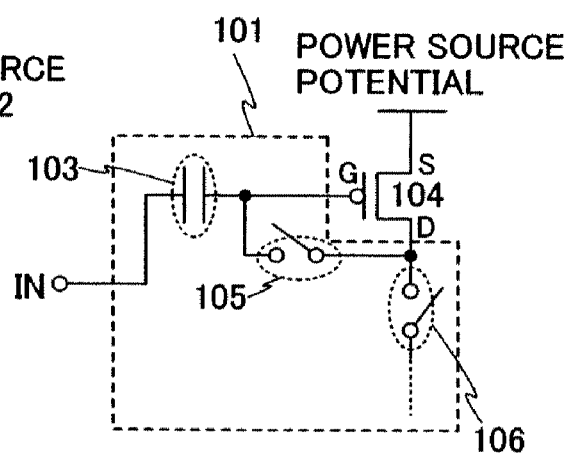
Figure 1D:
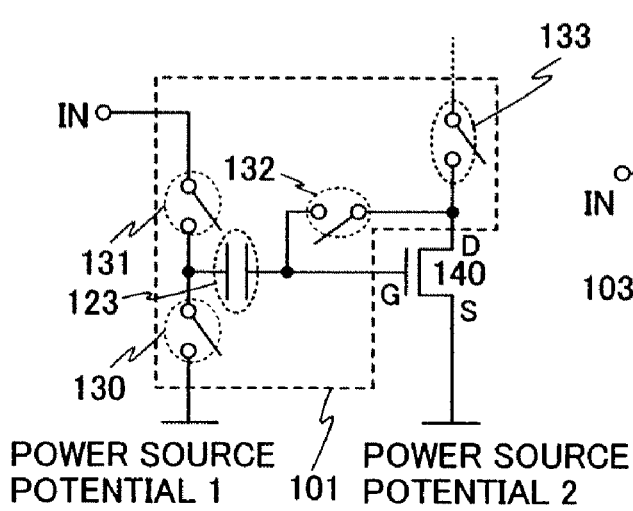

Hereinafter explained is the case where the inverter as shown in embodiment mode 1 is used as a clocked inverter. Regarding the inverter hereof, a signal with the same amplitude as that of the power source is inputted as a clock signal which is to be inputted to gates of the transistor 212 and a transistor 222, and a signal with a small amplitude is inputted as the input signal IN. Shown in this embodiment mode is a case where the configurations shown in FIGS. 1B and 1D are applied.

In the correcting unit of the digital circuit of the invention, a switch for controlling a potential supply to a drain of the transistor of which the gate is connected to a second electrode of a capacitor element among the transistors in the circuit element is provided. However, when there is already a switch which controls the potential supply to the drain of the transistor in circuit elements other than a correction unit, the switch may be a substitute for the former switch.

Figure 5:
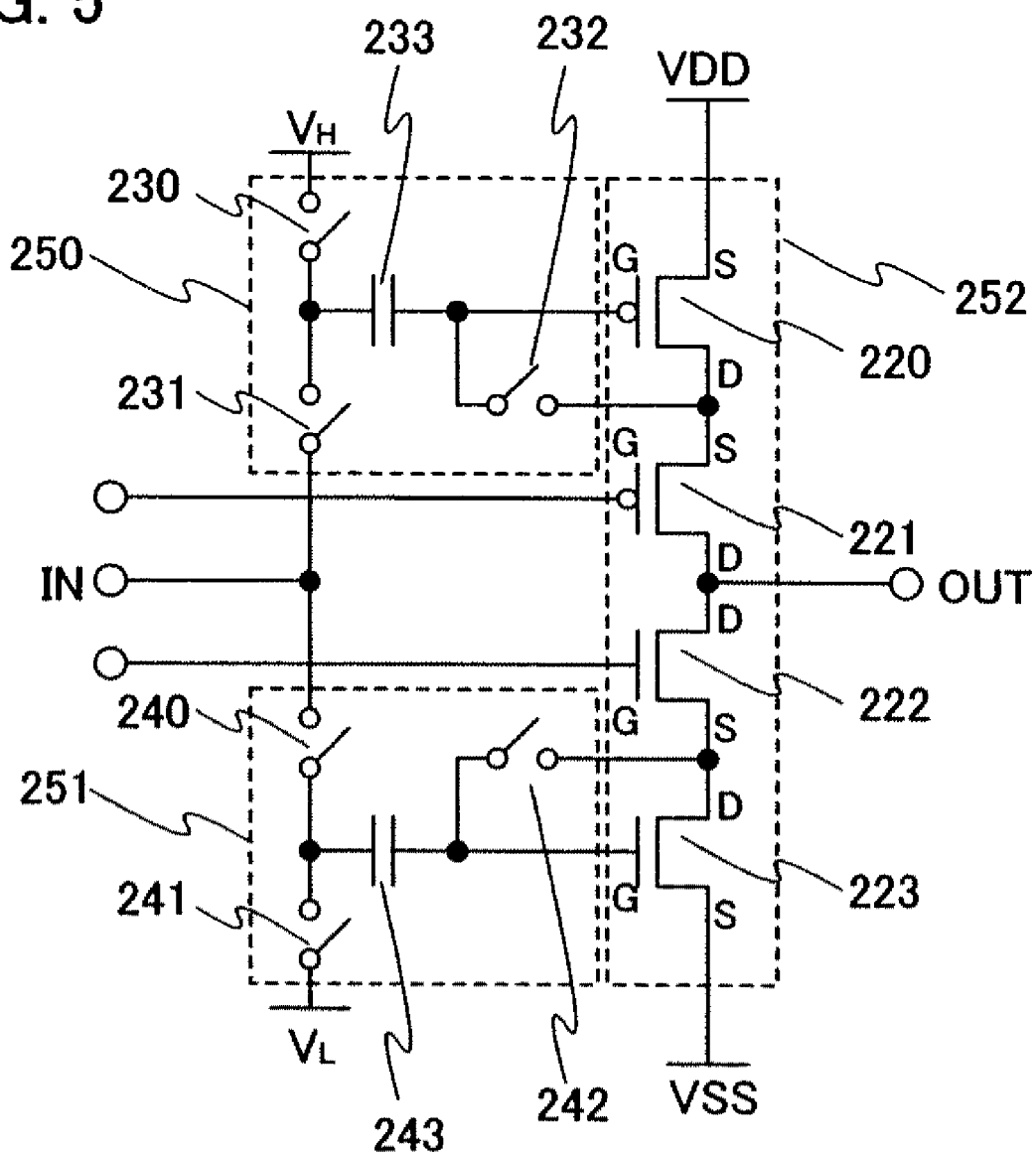
FIG. 5 is a diagram showing a configuration of a clocked inverter which is one of the digital circuits of the invention.

Shown in FIG. 5 is a configuration of the clocked inverter of the invention in the case of substituting switches. Reference numerals 250 and 251 in FIG. 5 denotes correcting units and 252 is a circuit element group.

The correcting unit 250 includes a first capacitor element 233 and three switches 230 to 232 for controlling the potential supply to the first capacitor element 233. The correcting unit 251 includes a second capacitor element 243 and three switches 240 to 242 for controlling the potential supply to the second capacitor element 243.

The switch 231 controls the supply of a potential of an input signal IN for a first electrode of the first capacitor element 233. The switch 230 controls the supply of a power source potential on the high potential side $V_H$ to the first electrode of the first capacitor element 233. The switch 232 controls the connection between a source and a drain of the p-channel type transistor 220 of which a gate is connected to a second electrode of the first capacitor element 233 among the transistors in the circuit element group 252.

The switch 241 controls the supply of the potential of the input signal IN for a first electrode of the second capacitor element 243. The switch 240 controls the supply of a power source potential on the low potential side $V_L$ for the first electrode of the second capacitor element 243. The switch 242 controls the connection between a source and a drain of the n-channel type transistor 223 of which a gate is connected to a second electrode of the second capacitor element 243 among the transistors in the circuit element group 252.

The circuit element group 252 includes two p-channel type transistors 220 and 221 and two n-channel type transistors 222 and 223. A first terminal (the source here) of the p-channel type TFT 220 receives a power source potential VDD. To a second terminal (the drain here) of the p-channel type TFT 220, the first terminal (the source here) of the p-channel type TFT 221 is connected.

Meanwhile, A first terminal (the source here) of the n-channel type TFT 223 receives a power source potential VSS. To a second terminal (the drain here) of the n-channel type TFT 223, the first terminal (the source here) of the n-channel type TFT 222 is connected. A second terminal (the drain here) of the p-channel type TFT 221 is connected to a second terminal (the drain here) of the n-channel type TFT 222, and a potential of the node is supplied to the subsequent circuit as a potential of an output signal OUT.

Meanwhile, the second electrode of the first capacitor element 233 is connected to a gate of the p-channel type transistor 220, and the second electrode of the second capacitor element 243 is connected to the gate of the n-channel type transistor 223.

In this embodiment mode, the p-channel type TFT 221 functions as a switch for controlling the potential supply to the drain of the p-channel type transistor 220. Also, the n-channel type TFT 222 functions as a switch for controlling the potential supply to the drain of the n-channel type transistor 223. That is, an output signal OUT synchronized with a signal such as a clock signal which is inputted to the transistors 221 and 222 is obtained.

Further, the clocked inverter as shown in FIG. 5 may be considered as one mode of the inverter as shown in FIG. 2. Therefore, the switch 207 corresponds to the p-channel type TFT and the switch 212 corresponds to the n-channel type TFT. That is, the p-channel type TFT 221 corresponds to the switch 207 and the n-channel type transistor 222 corresponds to the switch 212.

Therefore, the inverter as shown in FIG. 2 can be operated as a clocked inverter by changing the switching of the switches 207 and 212 during the normal operation. Specifically, the inverter can be operated as a clocked inverter by turning ON/OFF the switches 207 and 212 repeatedly by a clock signal or the like when an output signal OUT is to be synchronized with the clock signal, not by turning ON the switches constantly unless the correcting operation as shown in FIG. 3B is being conducted.

Note that, in this embodiment mode, the initialization of the charge and the storing operation of the potential difference which is to be corrected may be carried out simultaneously in the first capacitor element 233 and the second capacitor element 243 without depending on the potential of the input signal IN.

Note also that, VDD is higher than VSS (VDD>VSS), $V_H$ is higher than $V_L$ ($V_H$>$V_L$), VDD is higher than $V_H$ (VDD>$V_H$) and $V_L$ is higher than VSS ($V_L$>VSS). It is desirable that the power source potential $V_H$ is set lower than the potential on the high potential side of the input signal IN. Also, it is desirable that the power source potential $V_L$ is set higher than the potential on the low potential side of the input signal IN. In this embodiment mode, it is assumed that the potential on the high potential side of the input signal IN is equal to the power source potential $V_H$ and the potential on the low potential side of the input signal IN is equal to the power source potential $V_L$.

Embodiment Mode 3

Figure 1E:
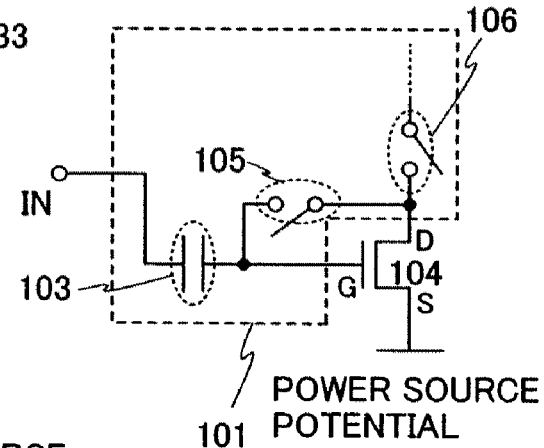

In this embodiment mode, a different configuration of the inverter which is one example of the digital circuits according to the invention from that described in the embodiment mode 1 will be described. The configurations shown in FIGS. 1C and 1E are applied to this embodiment mode.

Figure 6:
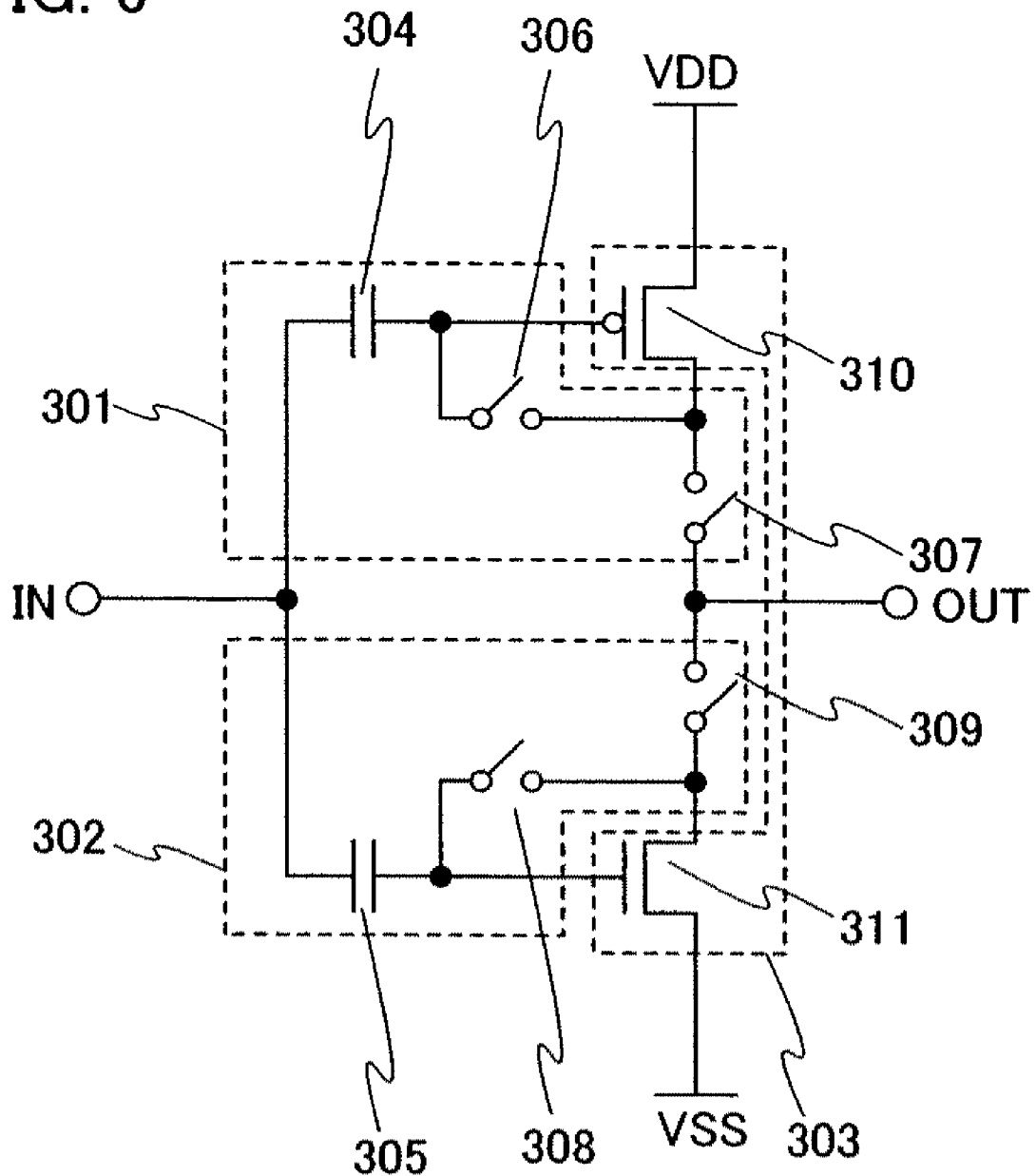
FIG. 6 is a diagram showing the second configuration of the inverter which is one of the digital circuits of the invention.

A configuration of an inverter of the embodiment mode will be shown in FIG. 6. Reference numerals 301 and 302 denote correcting units and reference numeral 303 denotes a circuit element group.

The correcting unit 301 includes a first capacitor element 304 and two switches 306 and 307 for controlling the potential supply to the first capacitor element 304. The correcting unit 302 includes a second capacitor element 305 and two switches 308 and 309 for controlling the potential supply to the second capacitor element 305.

The switch 306 controls a connection between a gate and a drain of a p-channel type transistor 310. The gate thereof is connected to a second electrode of the first capacitor element 304. The switch 307 controls a potential supply to a drain of the p-channel type transistor 310.

Meanwhile, the switch 308 controls a connection between a gate and a drain of an n-channel type transistor 311. The gate thereof is connected to a second electrode of the second capacitor element 305. The switch 309 controls a potential supply to the drain of the n-channel type transistor 311.

The circuit element group 303 includes one p-channel type transistor 310 and one n-channel type transistor 311. A first terminal (the source here) of the p-channel type transistor 310 receives a power source potential VDD and a first terminal of the n-channel type transistor 311 receives a power source potential VSS.

Further, a second terminal (the drain here) of the p-channel type transistor 310 and a second terminal (the drain here) of the n-channel type transistor 311 are connected respectively so that a subsequent circuit receive the potential as an output signal OUT when the switches 307 and 308 are ON respectively.

A second electrode of the first capacitor element 304 is connected to the gate of the p-channel type transistor 310 and a second electrode of the second capacitor element 305 is connected to the gate of the n-channel type transistor 311.

Note that, VDD>VSS. When a power source potential on the high potential side of an input signal IN is denoted $V_H$ and a power source potential on the low potential side of an input signal IN is denoted $V_L$, $V_H$ is higher than $V_L$ ($V_H$>$V_L$). Furthermore, VDD is higher than $V_H$, (VDD>$V_H$), and $V_L$ is higher than VSS ($V_L$>VSS).

Figure 7A:
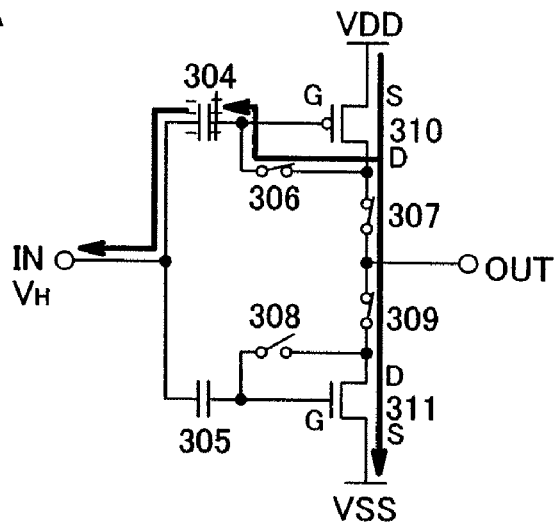
FIGS. 7A, 7B, and 7C are diagrams showing the operations of the inverter shown in FIG. 6.
Figure 7B:
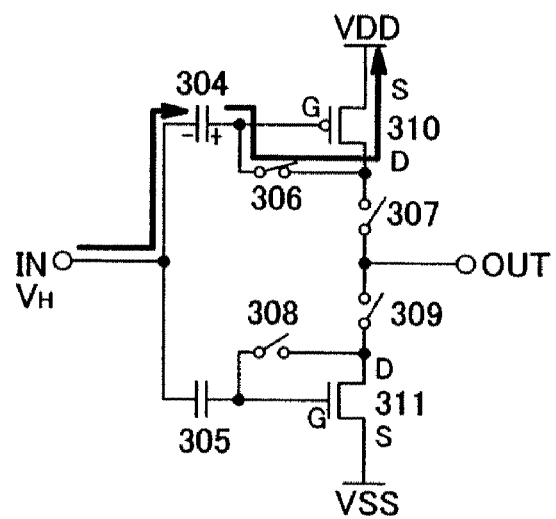

Hereinafter explained with reference to FIGS. 7 and 8 are operations of the inverter shown in FIG. 6. The operations of the inverter of this embodiment are distinguished as follows: an operation to initialize the charges held in the capacitor elements, an operation to store a potential difference which is to be corrected, and a normal operation as a primary function of the digital circuit. Yet, power source potential is supplied to each capacitor element in sequence.

First, the operation to initialize charges held in the first capacitor element 304 is explained. Specifically, the switches 306, 307, and 309 are turned ON and the switch 308 is turned OFF. By above operation, a first electrode of the first capacitor element 304 receives the potential on the high potential side $V_H$ of the input signal IN, and the second electrode of the first capacitor element 304 is connected to the drain of the p-channel type TFT 310.

As for the p-channel type TFT 310 at this time, $V_{GS}$ is lower than $V_{THp}$ ($V_{GS}$<$V_{THp}$) and it is turned ON. Therefore, predetermined charges are held in the first capacitor element 304. Note that, connection may vary as long as the switch 307 and the like are connected so that the transistor 310 can be turned ON.

As shown in FIG. 7, the switches 307, 308, and 309 are turned OFF and the switch 306 is turned ON. As the p-channel type TFT 310 is ON and VDD is higher than $V_H$ (VDD>$V_H$) right after the switches 307 and 309 are turned OFF, a drain current flows through the p-channel type TFT 310. Because of the drain current, the charges held in the first capacitor element 304 respectively are released and $V_{GS}$ approaches $V_{TH}$ gradually. Eventually, drain current flowing in the p-channel type transistor 310 becomes 0 when $V_{GS}$ becomes almost equivalent to $V_{TH}$. Note that, connection may vary as long as the drain of the transistor 310 is connected only to the gate.

Furthermore, the first capacitor element 304 holds a potential difference between a potential in which a threshold voltage $V_{THp}$ of the p-channel type TFT 310 is added to the power source potential VDD and a power source potential $V_H$ (referred to as $Vc_1$).

Figure 7C:
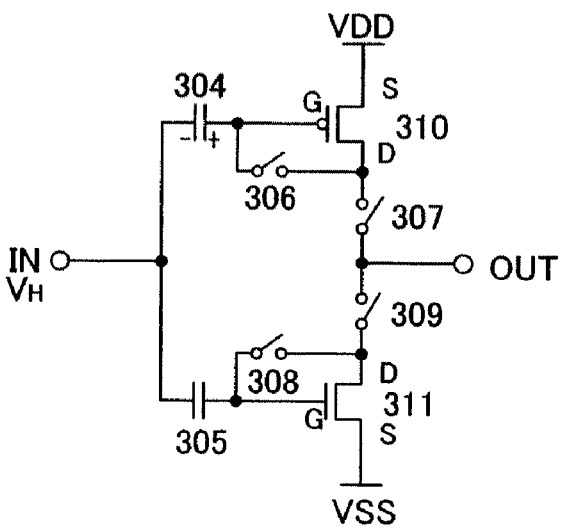

Then as shown in FIG. 7C, the charges accumulated in the first capacitor element 304 are held and the potential difference $Vc_1$ is stored by turning OFF the switches 306, 307, 308, and 309.

Figure 8A:
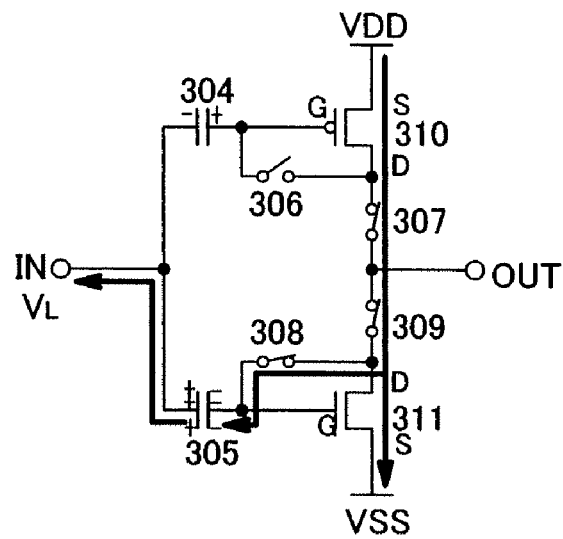
FIGS. 8A, 8B, and 8C are diagrams showing the operations of the inverter shown in FIG. 6.

After that, the charge held in the second capacitor element 305 is initialized. Specifically, the switches 307, 308, and 309 are turned ON and the switch 306 is turned OFF as shown in FIG. 8A. By above operation, the first electrode of the second capacitor element 305 receives the potential $V_L$ on the low potential side of an input signal IN, and the second electrode of the second capacitor element 305 is connected to the drain of the n-channel type TFT 311.

As for the p-channel type TFT 310, $V_{GS}$ is lower than $V_{THp}$ ($V_{GS}$<$V_{THp}$) and it is turned ON. Therefore, predetermined charges are accumulated in the second capacitor element 305. Note that, connection may vary as long as the switch 307 is connected so that the transistor 310 can be turned ON.

Figure 8B:
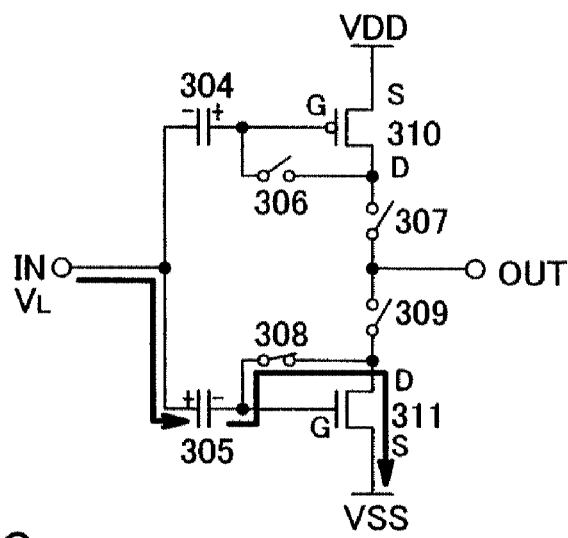

As shown in FIG. 8B, the switches 306, 307, and 309 are turned OFF and the switch 308 is turned ON. As the n-channel type TFT 311 is ON and VSS<$V_L$ is established right after the switches 307 and 309 are turned OFF, a drain current flows through the n-channel type TFT 311. Because of this drain current, the charges held in the second capacitor element 305 respectively are released and $V_{GS}$ approaches $V_{TH}$ gradually. Eventually, drain current in the n-channel type TFT 311 becomes 0 when $V_{GS}$ becomes almost equivalent to $V_{TH}$. Note that, connection may vary as long as the drain of the transistor 310 is connected only to the gate.

Furthermore, the second capacitor element 305 holds a potential difference between a potential in which a threshold voltage $V_{THn}$ of the n-channel type TFT 311 is added to the power source potential VSS and a power source potential $V_L$ (referred to as $Vc_2$).

Figure 8C:
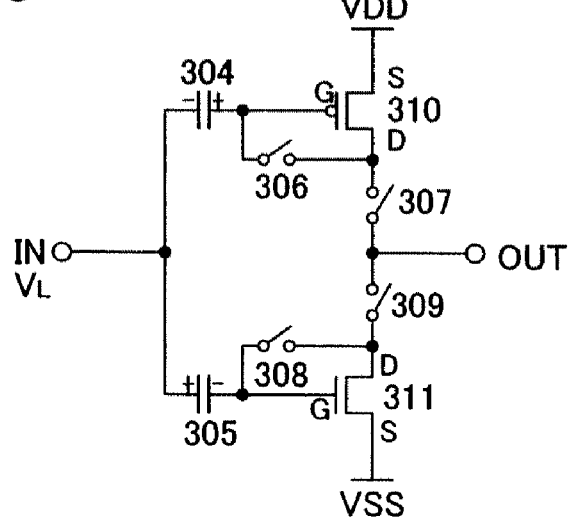

Then as shown in FIG. 8C, the charges accumulated in the first capacitor element 304 and the second capacitor element 305 are held and the potential difference $Vc_1$ and $Vc_2$ are stored respectively by turning OFF the switches 306, 307, 308, and 309.

Note that, charges may be accumulated into either the first capacitor element 303 or the second capacitor element 304 earlier, that is, the operations of FIGS. 7A to 7C and 8A to 8C may be performed in random order.

In normal operation, the potential of the input signal is corrected in accordance with the stored potential difference. Note that, the switches 306 and 308 are turned OFF at all times in normal operation, while the switches 307 and 309 are turned ON at all times when not using a clocked inverter but a mere inverter. The switches 307 and 309 can be used as one of the switches in the clocked inverter as well. The operation in this case is shown in FIG. 19.

Figure 19A:
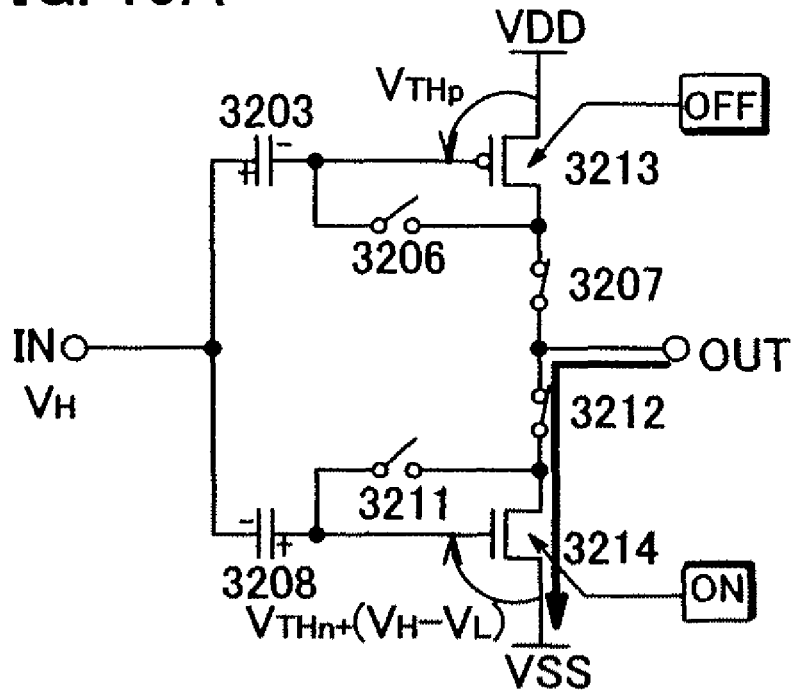
FIGS. 19A and 19B are diagrams showing configurations of the clocked inverter of the invention.

Hereinafter explained with reference to FIG. 19A is an operation in the case where a potential of the input signal IN is on the high potential side (referred to as $V_H$ in this embodiment mode).

In normal operation, switches 3207, 3212 are ON and the switches 3206 and 3211 are OFF at all times. A first electrode of a first capacitor element 3203 and a first electrode of a second capacitor element 3208 receive the potential of the input signal $V_H$.

The potential difference between two electrodes of the first capacitor element 3203 and the potential difference between two electrodes of the second capacitor element 3208 are unchanged as $Vc_1$ and $Vc_2$ following the law of conservation of charge. Therefore, the potential of the second electrode of the first capacitor element 3203 is kept at a potential in which the potential difference $Vc_1$ is added to the potential $V_H$ when the first electrode of the first capacitor element 3203 receives the potential $V_H$. The potential difference at this time establishes $Vc_1=VDD+V_{THp}-V_H$, which means the potential of the second electrode of the first capacitor element 3203 is $VDD+V_{THp}$. A gate of a p-channel type transistor 3213 receives a potential of the second electrode $VDD+V_{THp}$, and a gate voltage of the p-channel type transistor 3213 is $V_{GS}=V_{THp}$, thus the p-channel type transistor 3213 is turned OFF.

On the other hand, the potential of the second electrode of the second capacitor element 3208 is kept at a potential in which the potential difference $Vc_2$ is added to the potential $V_H$ when the first electrode thereof receives the potential $V_H$. The potential difference at this time is $Vc_2=VSS+V_{THn}-V_L$, which means the potential of the second electrode of the second capacitor element 3208 is $V_H+VSS+V_{THn}-V_L$. Therefore, the gate voltage of the n-channel type transistor 3214 is $V_{GSn}=V_H+V_{THn}-V_L$. Here, $V_H>V_L$, so $V_{GSn}-V_{THn}=V_H-V_L>0$, thus the n-channel type transistor 3214 is turned ON.

Consequently, when the potential of the input signal IN is $V_H$, a subsequent circuit receives the power source potential VSS as a potential of an output signal.

Figure 19B:
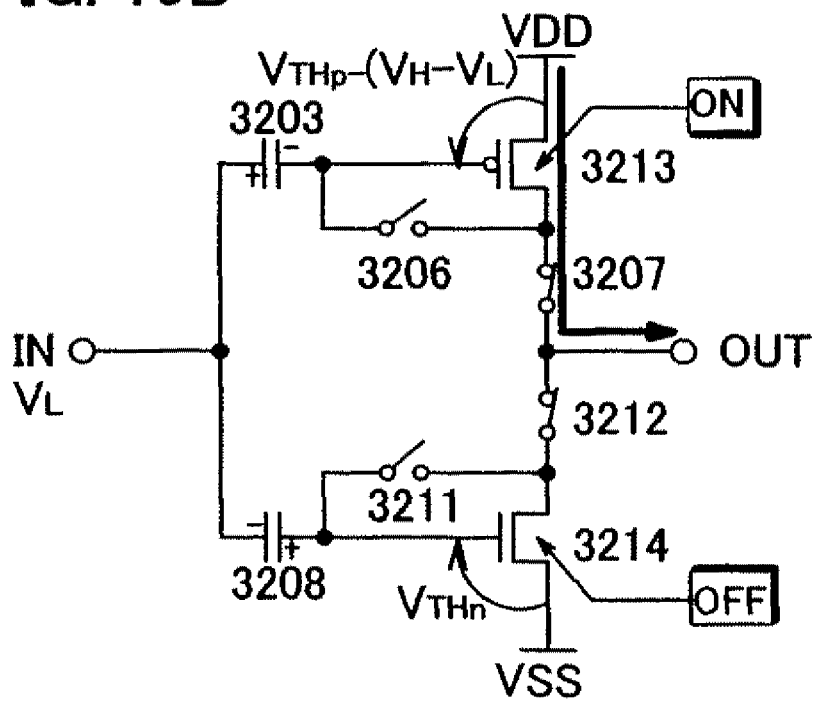

Hereinafter explained with reference to FIG. 19B is an operation in the case where the potential of the input signal IN is on the low potential side ($V_L$ in this embodiment mode).

In normal operation, the switches 3207 and 3212 are turned ON and the switches 3206 and 3211 are turned OFF as described above. Further, the first electrode of the first capacitor element 3203 and the first electrode of the second capacitor element 3208 receive the potential of the input signal, $V_L$.

The potential difference between the two electrodes of the first capacitor element 3203 and the potential difference between the two electrodes of the second capacitor element 3208 are unchanged as $Vc_1$ and $Vc_2$ following the law of conservation of charge. Therefore, the potential of the second electrode of the first capacitor element 3203 is kept at a potential in which the potential difference $Vc_1$ is added to the potential $V_L$ when the first electrode of the first capacitor element receives the potential $V_L$. The potential difference at this time is $Vc_1=VDD+V_{THp}-V_H$, which means the potential of the second electrode of the first capacitor element 3203 is $V_L+VDD+V_{THp}-V_H$. Therefore, the gate voltage of the p-channel type transistor 3213 is $V_{GS}=V_L+V_{THp}-V_H$. Now $V_H>V_L$, so $V_{GSp}-V_{THp}=V_L-V_H<0$ is established, thus the p-channel type transistor 321 is turned ON.

On the other hand, the potential of the second electrode of the second capacitor element 3208 is kept at the potential of the addition of the potential $V_L$ and the potential difference $Vc_2$ when the first electrode thereof receives the potential $V_L$. The potential difference at this time is $Vc_2=VSS+V_{THn}-V_L$, which means the potential of the second electrode of the second capacitor element 3208 is $VSS+V_{THn}$. The gate of the n-channel type transistor 3214 receives the potential of the second electrode $VSS+V_{THn}$, and the gate voltage of the n-channel type transistor 3214 satisfies $V_{GS}=V_{THn}$, thus the n-channel type transistor 3214 is turned OFF.

Consequently, when the potential of the input signal IN is $V_L$, a subsequent circuit receives the power source potential VDD as a potential of an output signal.

According to the above configuration of the invention, a digital circuit can be operated normally regardless of the potential of the input signal.

There may be two switches for controlling the potential supply to the drains of the transistors 3213 and 3214. That is, additional switches may be provided for controlling the potential supply to the drains of transistors through a different path from those of the first switches 3207 and 3212.

According to the above configuration of the invention, a digital circuit can be operated normally regardless of the potential of the input signal. Furthermore, the number of switches for correcting units can be reduced as compared to the digital circuit shown in FIG. 2, therefore an effect of the invention can be obtained with a simplified configuration.

Embodiment Mode 4

In this embodiment mode, a configuration of an NAND, which is one of the digital circuits of the invention will be described.

The NAND in this embodiment mode which is shown in FIG. 9 includes four correcting units 401 to 404 and a circuit element group 405. In FIG. 9, the configurations of FIGS. 1B and 1D are employed.

The correcting unit 401 includes a first capacitor element 406 and four switches 407 to 410 for controlling the potential supply to the first capacitor element 406. The correcting unit 402 includes a second capacitor element 411 and four switches 412 to 415 for controlling the potential supply to the second capacitor element 411. The correcting unit 403 includes a third capacitor element 416 and five switches 417 to 420 and 426 for controlling a potential supply to the third capacitor element 416. A correcting unit 404 includes a fourth capacitor element 421 and four switches 422 to 425 for controlling a potential supply to the fourth capacitor element 421.

The switch 407 controls a potential supply of an input signal $IN_1$ to a first electrode of the first capacitor element 406. The switch 408 controls a supply of a power source potential on the high potential side $V_H$ to a first electrode of the first capacitor element 406. The switch 409 controls a connection between a gate and a drain of a p-channel type transistor 430 of which a gate is connected to a second electrode of the first capacitor element 406 among the transistors in the circuit element group 405. The switch 410 controls a potential supply to the drain of the p-channel type transistor 430.

The switch 412 controls a potential supply of an input signal $IN_2$ to a first electrode of the second capacitor element 411. The switch 413 controls a supply of the power source potential on the high potential side $V_H$ to a first electrode of the second capacitor element 411. The switch 414 controls a connection between a gate and a drain of a p-channel type transistor 431 of which the gate is connected to a second electrode of the third capacitor element 416 among the transistors in the circuit element group 405. The switch 415 controls a potential supply to the drain of the p-channel type transistor 431.

The switch 418 controls a potential supply of the input signal $IN_1$ to a first electrode of the third capacitor element 416. The switch 417 controls a supply of a power source potential on the low potential side $V_L$ to a first electrode of the third capacitor element 416. The switch 419 controls a connection between a gate and a drain of an n-channel type transistor 432 of which the gate is connected to a second electrode of the third capacitor element 416. The switch 420 controls the potential supply to the drain of the n-channel type transistor 432. The switch 426 controls a supply of a power source potential VSS to the drain of the n-channel type transistor 432.

The switch 423 controls a potential supply of the input signal $IN_2$ to a first electrode of the fourth capacitor element 421. The switch 422 controls a supply of a power source potential on the low potential side $V_L$ to the first electrode of the fourth capacitor element 421. The switch 424 controls a connection between a gate and a drain of an n-channel type transistor 433 of which the gate is connected to a second electrode of the fourth capacitor element 421 among the transistors of the circuit element group 405. The switch 425 controls a potential supply to the drain of the n-channel type transistor 433.

The circuit element group 405 includes two p-channel type transistors 430 and 431 and two n-channel type transistors 432 and 433. A first terminal (the source here) of the p-channel type transistor 430 and a first terminal (the source here) of the p-channel type transistor 431 receive a power source potential VDD. A second terminal (the drain here) of the p-channel type transistor 430 and a second terminal (the drain here) of the p-channel type transistor 431 are connected so that the subsequent circuit receive the potential as an output signal OUT when the switches 410 and 415 are ON respectively. Furthermore, a first terminal (the source here) of the n-channel type transistor 432 receives the power source potential VSS. The second terminal (the drain here) of the n-channel type transistor 432 is connected so that a first terminal (the source here) of the n-channel type transistor 433 receives the potential thereof when the switch 420 is ON. The second terminal (the drain here) of the n-channel type transistor 433 is connected so that the subsequent circuit receives the potential as an output signal OUT when the switch 425 is ON.

The second electrode of the first capacitor element 406 is connected to the gate of the p-channel type transistor 430. The second electrode of the second capacitor element 411 is connected to the gate of the p-channel type transistor 431. The second electrode of the third capacitor element 416 is connected to the gate of the n-channel type transistor 432. The second electrode of the fourth capacitor element 421 is connected to the gate of the n-channel type transistor 433.

Note that, VDD is higher than VSS (VDD>VSS), and $V_H$ is higher than $V_L$ ($V_H$>$V_L$). Also note that VDD is higher than $V_H$ (VDD>$V_H$), and $V_L$ is higher than VSS ($V_L$>VSS). In this embodiment mode, it is assumed that a potential on the high potential side of the input signal is equal to the power source potential $V_H$ and the potential on the low potential side is equal to the power source potential $V_L$. The invention, however, is not exclusively limited to this structure. The switches 408, 413, 417, or 422 may control a supply of a power source potential $V_H'$ which is different from the power source potential $V_H$ or a power source potential $V_L'$ which is different from the power source potential $V_L$. In this case, when the potential on the high potential side of the input signal is $V_H$ and the potential on the low potential side is $V_L$, $V_L$ is lower than $V_H'$ ($V_L$<$V_H'$) and $V_H$ is higher than $V_L'$ ($V_H$>$V_L'$). Moreover, it is desirable that $V_H'$ is equal or higher than $V_H$ ($V_H' \geq V_H$) and $V_L'$ is equal or lower than $V_L$ ($V_L' \leq V_L$).

In this embodiment mode, a power source potential to be supplied to the first electrode of the first capacitor element 406 and a power source potential to be supplied to the first electrode of the second capacitor element 411 are both $V_H$. Similarly, a power source potential to be supplied to the first electrode of the third capacitor element 416 and a power source potential to be supplied to the first electrode of the fourth capacitor element 421 are both $V_L$, however, this embodiment mode is not exclusively limited to this configuration and the potentials may vary. In this case also, $V_H$>$V_L$, VDD>$V_H$, and $V_L$>VSS are to be satisfied.

With respect to the operations of the NAND which is shown in FIG. 9, there are an operation to initialize the charges held in the capacitor elements, an operation to store the potential difference which is to be corrected, and a normal operation as a primary function of a digital circuit.

As for a switching operation of each correcting unit regarding the operation to initialize the charges held in the capacitor elements, the operation to store the potential difference which is to be corrected, and the normal operation as a primary function of a digital circuit, embodiment mode 1 can be referred. It is to be noted that the switch 426 is turned OFF when initialization is performed, turned ON when the potential difference is obtained and charge is stored, and turned OFF when the normal operation is carried out.

According to the above configuration of the invention, a digital circuit can be operated normally regardless of the potential of the input signal.

There may be two switches for controlling the potential supply to the drains of the transistors not only in the correcting unit 403 but also in the correcting units 401, 402, or 404. That is, additional switches may be provided for controlling the potential supply to the drains of the transistors through a different path from those of the first switches 410, 415, and 425.

Figure 20:
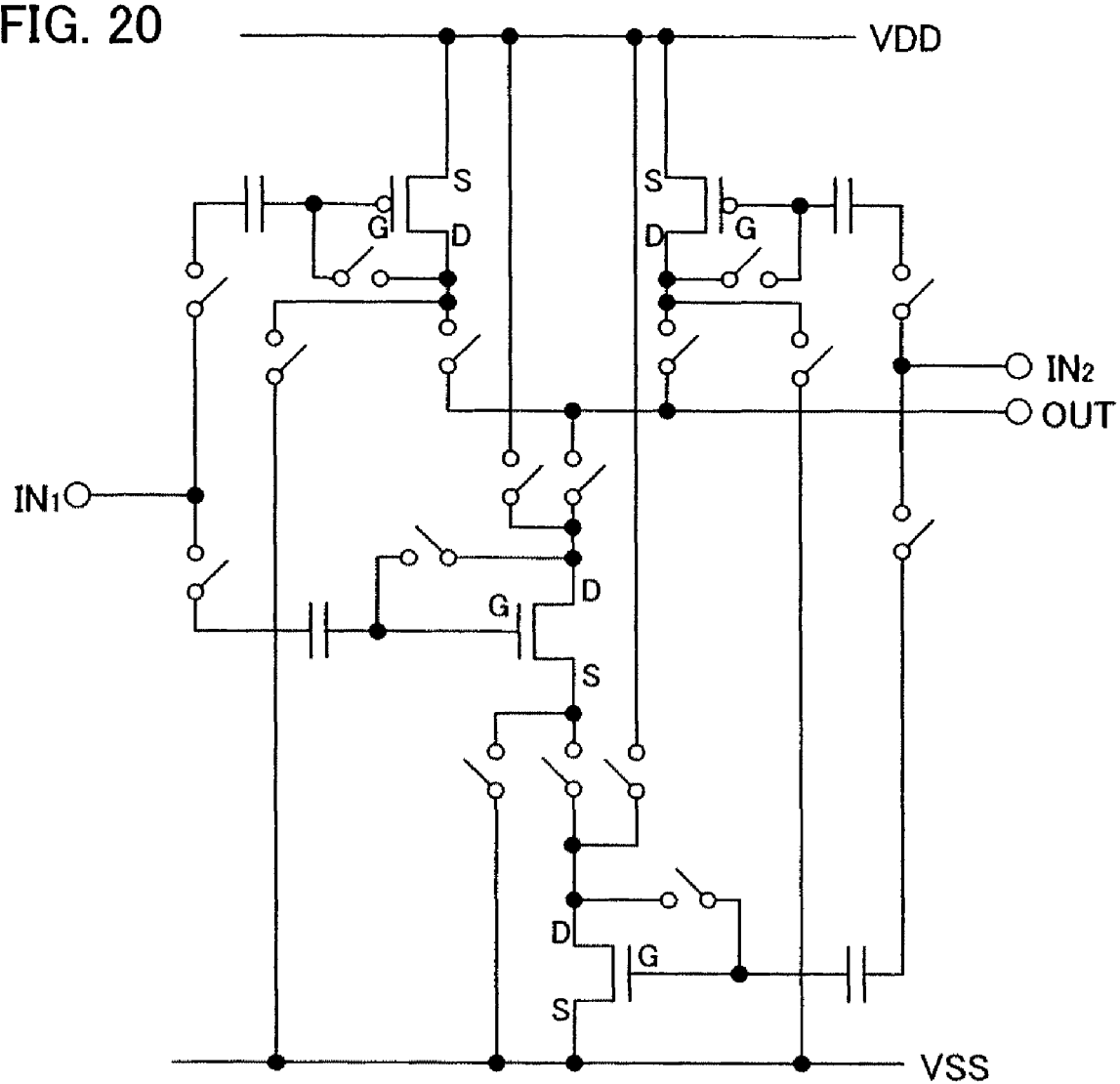
FIG. 20 is a diagram showing a configuration of a NAND of the invention.

Note that, the configurations of FIGS. 1B and 1D are applied to NAND in this embodiment mode, however, the configurations of FIGS. 1C and 1E may be applied as well. The configurations of FIGS. 1C and 1E are applied to FIG. 20.

Embodiment Mode 5

In this embodiment mode, a configuration of a NOR which is one of the digital circuits of the invention will be described.

Figure 10:
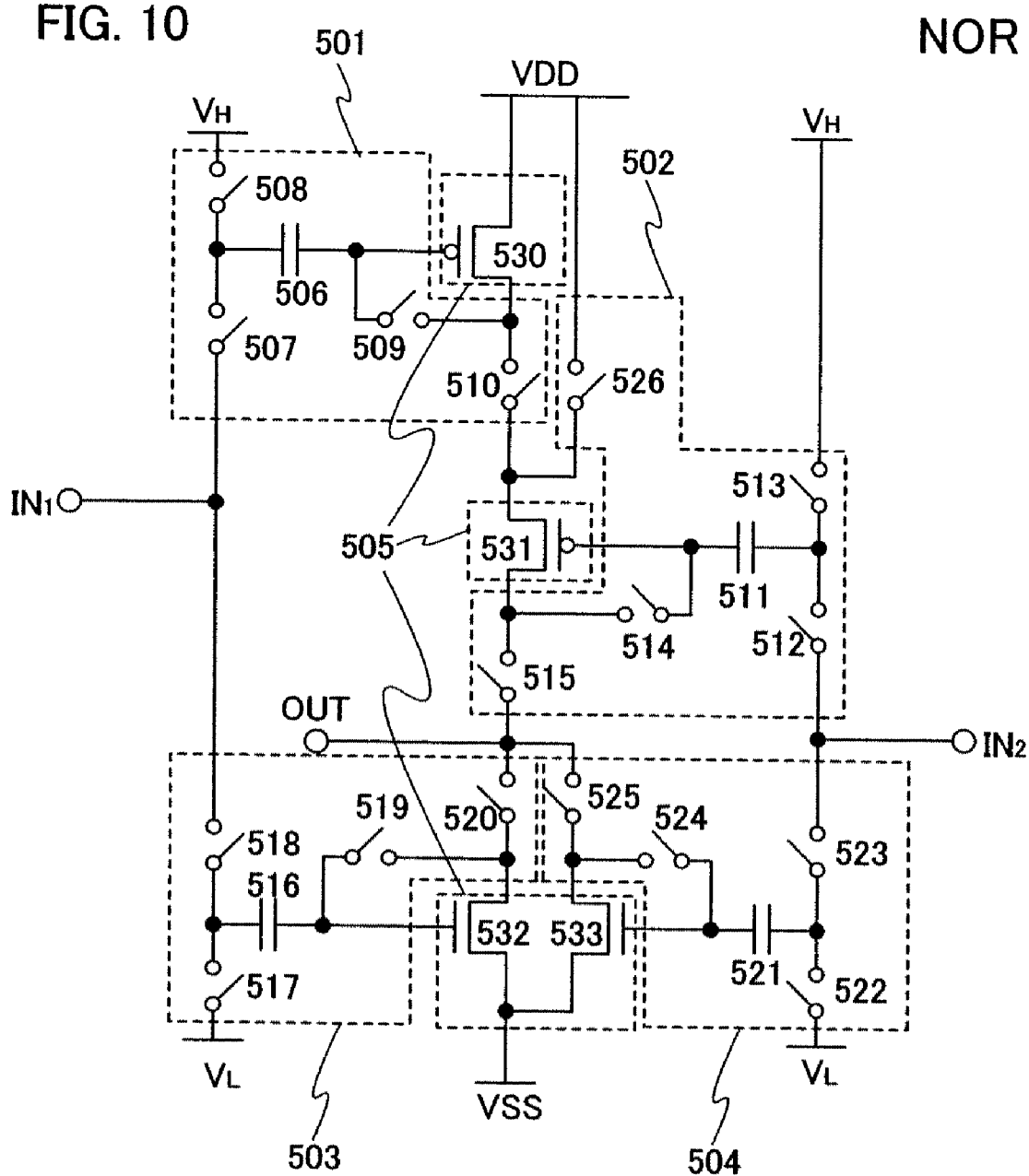
FIG. 10 is a diagram showing the first configuration of a NOR which is one of the digital circuits of the invention.

The NOR in this embodiment mode which is shown in FIG. 10 includes four correcting units 501 to 504 and a circuit element group 505. The correcting unit shown in FIGS. 1B and 1D are applied to FIG. 10.

The correcting unit 501 includes a first capacitor 506, four switches 507 to 510 for controlling the potential supply to the first capacitor element 506. The correcting unit 502 includes a second capacitor element 511, five switches 512 to 515 and 526 for controlling the potential supply to the second capacitor element 511. The correcting unit 503 includes a third capacitor element 516, four switches 517 to 520 for controlling the potential supply to the third capacitor element 516. The correcting unit 504 includes a fourth capacitor element 521, four switches 522 to 525 for controlling the potential supply to the fourth capacitor element 521.

The switch 507 controls a potential supply of an input signal $IN_1$ to a first electrode of the first capacitor element 506. The switch 508 controls a supply of a power source potential on the high potential side $V_H$ to the first electrode of the first capacitor element 506 among the transistors in the circuit element group 505. The switch 509 controls a connection between a gate and a drain of a p-channel type transistor 530 of which gate is connected to a second electrode of the first capacitor element 506. The switch 510 controls the potential supply to the drain of the p-channel type transistor 530.

The switch 512 controls a potential supply of an input signal $IN_2$ for a first electrode of the second capacitor element 511. The switch 513 controls a supply of the power source potential on the high potential side $V_H$ to the first electrode of the second capacitor element 511. The switch 514 controls a connection between a gate and a drain of a p-channel type transistor 531 of which the gate is connected to a second electrode of the second capacitor element 511 among the transistors in the circuit element group 505. The switch 515 controls a potential supply to the drain of the p-channel type transistor 531. The switch 526 controls a potential supply to the source of the p-channel type transistor 531.

The switch 518 controls a potential supply of the input signal $IN_1$ to a first electrode of the third capacitor element 516. The switch 517 controls a supply of a power source potential on the low potential side $V_L$ to the first electrode of the third capacitor element 516 among the transistors in the circuit element group 505. The switch 519 controls a connection between a gate and a drain of an n-channel type transistor 532 of which the gate is connected to a second electrode of the third capacitor element 516. The switch 520 controls a potential supply to the drain of the n-channel type transistor 532.

The switch 523 controls a potential supply of the input signal $IN_2$ to a first electrode of the fourth capacitor element 521. The switch 522 controls a supply of the power source potential on the low potential side $V_L$ to the first electrode of the fourth capacitor element 521. The switch 524 controls a connection between a gate and a drain of an n-channel type transistor 533 of which the gate is connected to a second electrode of the fourth capacitor element among the transistors in the circuit element group 505. The switch 525 controls a potential supply to the drain of the n-channel type transistor 533.

The circuit element group 505 includes two p-channel type transistors 530 and 531, and two n-channel type transistors 532 and 533. A first terminal (the source here) of the p-channel type transistor 530 receives a power source potential VDD. A second terminal (the drain here) of the p-channel type transistor 530 is connected so that a first terminal (the source here) of the p-channel type transistor 531 receives the potential when the switch 510 is ON. A second terminal (the drain here) of the p-channel type transistor 531 is connected so that the subsequent circuit receives the potential as an output signal OUT when the switch 515 in ON. A first terminal (the source here) of the n-channel type transistor 532 and a first terminal (the source here) of the n-channel type transistor 533 receive a power source potential VSS. The second terminal (the drain here) of the n-channel type transistor 532 and a second terminal (the drain here) of the n-channel type transistor 533 are connected so that the subsequent circuit receive the potential as an output signal OUT when the switches 520 and 525 are ON respectively.

The second electrode of the first capacitor element 506 is connected to the gate of the p-channel type transistor 530. The second electrode of the second capacitor element 511 is connected to the gate of the p-channel type transistor 531. The second electrode of the third capacitor element 516 is connected to the gate of the n-channel type transistor 532. The second electrode of the fourth capacitor element 521 is connected to the gate of the n-channel type transistor 533.

Note that, VDD is higher than VSS (VDD>VSS), $V_H$ is higher than $V_L$ ($V_H>V_L$), VDD is higher than $V_H$ (VDD>$V_H$) and $V_L$ is higher than VSS ($V_L$>VSS). It is assumed in this embodiment mode that the potential on the high potential side of the input signal is equal to the power source potential $V_H$ and the potential on the low potential side of the input signal is equal to the power source potential $V_L$. The invention, however, is not exclusively limited to this configuration. The switches 508, 513, 517, or 522 may control a supply of a power source potential $V_H'$ which is different from the power source potential $V_H$ and a power source potential $V_L'$ which is different from the power source potential $V_L$. In this case, when the potential on the high potential side of the input signal is $V_H$ and the potential on the low potential side is $V_L$, $V_L$ is lower than $V_H'$ ($V_L<V_H'$) and $V_H$ is higher than $V_L'$ ($V_H>V_L'$). Moreover, it is desirable that $V_H'$ is equal or higher than $V_H$ ($V_H' \geq V_H$) and $V_L'$ is equal or lower than $V_L$ ($V_L' \leq V_L$).

In this embodiment mode, a power source potential to be supplied to the first electrode of the first capacitor element 506 and a power source potential to be supplied to the first electrode of the second capacitor element 511 are both $V_H$, however, this embodiment mode is not exclusively limited to the configuration. That is, their potentials may vary. In this case also, $V_H>V_L$, VDD>$V_H$, and $V_L$>VSS are to be satisfied.

With respect to the operations of the NOR which is shown in FIG. 10, there are an operation to initialize the charges held in the capacitor elements, an operation to store the potential difference which is to be corrected, and a normal operation as a primary function of a digital circuit.

As for a switching operation of each correcting unit regarding the operation to initialize the charge held in the capacitor element, the operation to store the potential difference which is to be corrected, and the normal operation as a primary function of a digital circuit, the embodiment mode 1 can be referred. It is to be noted that the switch 526 is turned OFF when initialization is performed, turned ON when the potential difference is acquired and charge is stored, and turned OFF when the normal operation is carried out.

According to the above configuration of the invention, a digital circuit can be operated normally regardless of the potential of the input signal.

There may be two switches for controlling the potential supply to the drains of the transistor not only in the correcting unit 501 but also in the correcting units 502, 503, or 504. That is, additional switches may be provided for controlling the potential supply to the drains of the transistors through a different path from those of the first switches 520, 515, and 525.

Figure 21:
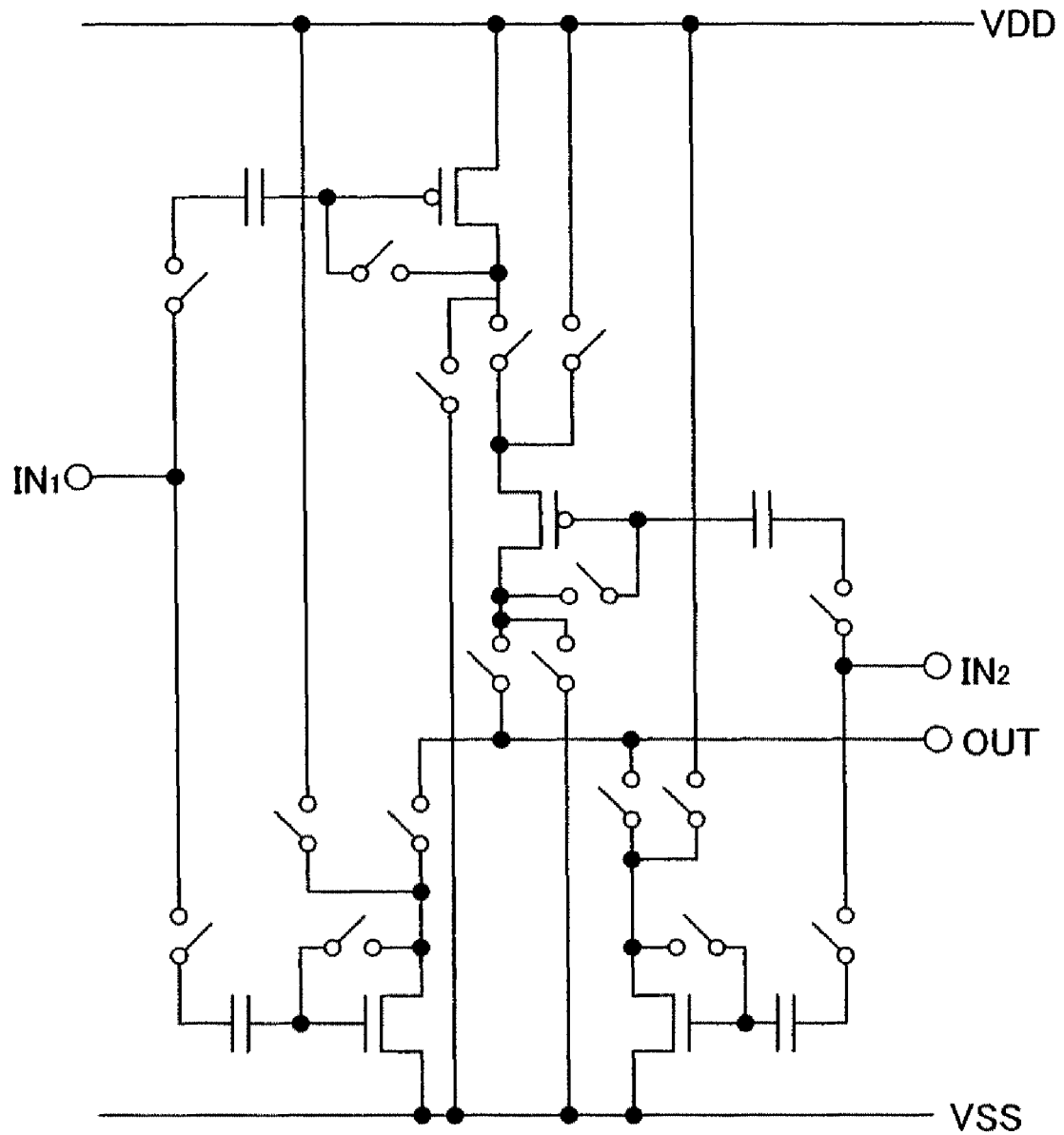
FIG. 21 is a diagram showing a configuration of a NOR of the invention.

Note that, the configurations of FIGS. 1B and 1D are applied to a NOR in this embodiment mode, however, the configurations of FIGS. 1C and 1E may be applied as well. The configurations of FIGS. 1C and 1E are applied to FIG. 21.

A transistor used for the digital circuit of the invention may be a single crystalline silicon transistor, an SOI transistor, or a thin film transistor utilizing a polycrystalline semiconductor or a semi-amorphous semiconductor, or an amorphous semiconductor, or a transistor utilizing an organic semiconductor, a carbon nanotube, or the like. Furthermore, the type of substrate on which a transistor is mounted is not exclusively limited to a certain type. It may be a single crystalline substrate, an SOI substrate, or a glass substrate, and the like.

Embodiment 1

Hereinafter explained are a configuration and driving of the clocked inverter of the invention which is applied to a signal line driver circuit of a semiconductor display device.

Figure 11A:
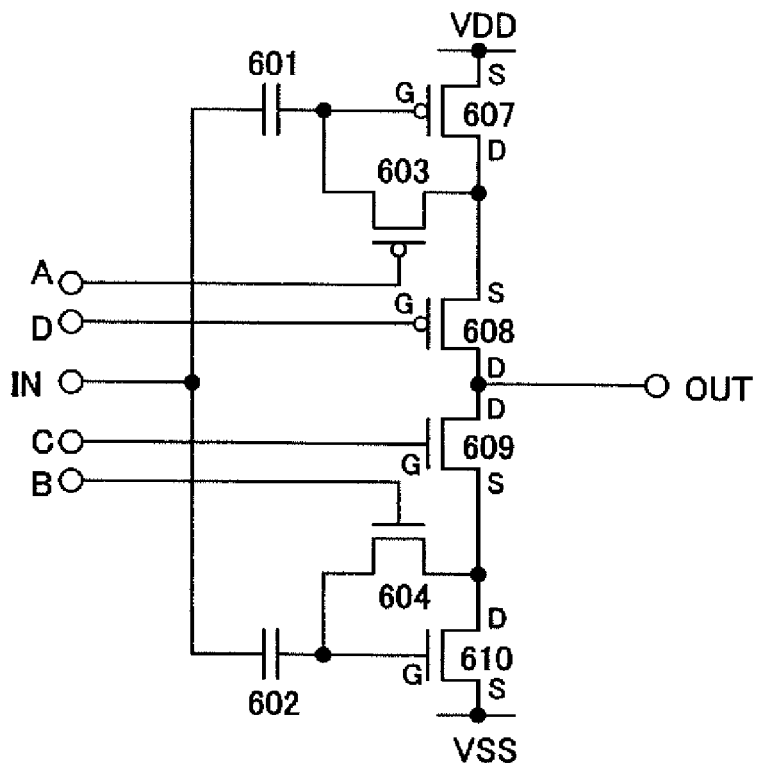
FIGS. 11A and 11B are diagrams showing an equivalent circuit diagram and a timing chart of the clocked inverter of the second configuration of the invention.

A circuit diagram of the clocked inverter which is applied in this embodiment mode is shown in FIG. 11A. An inverter shown in FIG. 6 is applied in FIG. 11A as a clocked inverter in FIG. 11A, by applying transistors to the switches 306 to 309 of the inverter shown in FIG. 6.

Note that, signals having small amplitude are inputted as the input signal IN, and the signals having the same amplitude as the power source are inputted to A, B, C, and D. The signals inputted as the input signal IN are outputted as the output signal OUT in synchronism with synchronized signals such as the latch pulse, clock signal, and sampling pulse outputted from a shift register, which are inputted to C, D.

The clocked inverter shown in FIG. 11A includes a first capacitor element 601, a second capacitor element 602, p-channel type transistors 603, 607, and 608, and n-channel type transistors 604, 609, and 610.

A first electrode of the first capacitor element 601 and a first electrode of the second capacitor element 602 are connected to each other and receive a potential of the input signal IN. A second electrode of the first capacitor element 601 is connected to a gate of the p-channel type transistor 607. A second electrode of the second capacitor element 602 is connected to a gate of the n-channel type transistor 610.

Either a first terminal or second terminal of the p-channel type transistor 603 is connected to a gate of the p-channel type TFT 607, and the other is connected to a second terminal (the drain here) of the p-channel type TFT 607. Either a first terminal or second terminal of the n-channel type transistor 604 is connected to the gate of the n-channel type TFT 610, and the other is connected to a second terminal (the drain here) of the n-channel type TFT 610.

A first terminal (the source here) of the p-channel type transistor 607 receives the power source potential VDD. A second terminal (the drain here) of the p-channel type transistor 607 and a first terminal (the source here) of the p-channel type transistor 608 are connected to each other. Furthermore, a first terminal (the source here) of the n-channel type transistor 610 receives a power source potential VSS. A second terminal (the drain here) of the n-channel type transistor 610 is connected to a first terminal (the source here) of the n-channel type transistor 609. A second terminal (the drain here) of the n-channel type transistor 609 is connected to a second terminal (the drain here) of the p-channel type transistor 608. Note that, the potentials of the second terminal of the n-channel type transistor 609 and a potential of the second terminal of the p-channel type transistor 608 are supplied to the subsequent circuit as the potential of the output signal OUT.

Figure 11B:
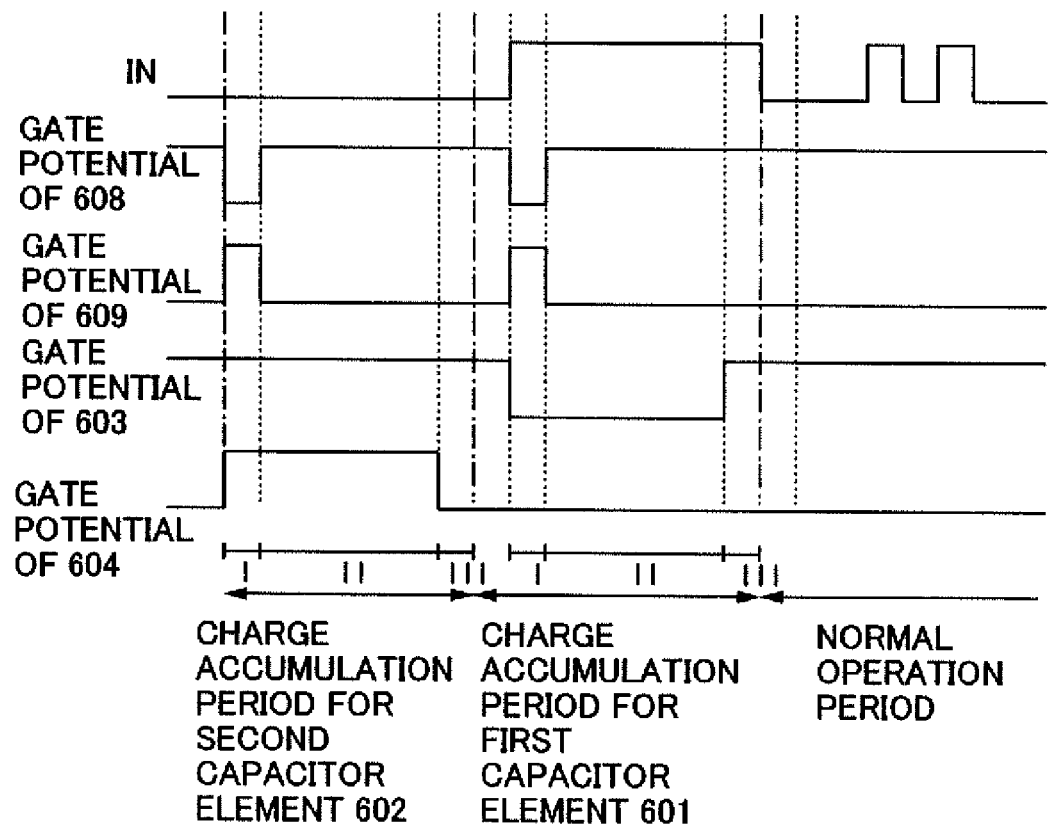

Shown in FIG. 11B is a timing chart of the potential of the input signal IN and the potentials of the gates of the p-channel type transistors 603 and 608 and the gates of the n-channel type transistors 604 and 609 during the periods to accumulate charges in the second capacitor element 602, and the first capacitor element 601, and the period to perform a normal operation.

As shown in FIG. 11B, in the charge accumulation period for the second capacitor element 602, three operations are conducted, i.e., the operation I for initializing the second capacitor element, the operation II for obtaining the potential difference, and the operation III for storing the charges.

As for the operation I for initialization, the p-channel type transistor 603 is turned OFF and the n-channel type transistor 604 is turned ON. Also, the p-channel type TFT 608 is turned ON and the n-channel type TFT 609 is turned ON. The potential of the input signal IN is maintained at the potential $V_L$ on the low potential side.

As for the operation II for acquiring the potential difference, the p-channel type transistor 603 is held OFF and the n-channel type transistor 604 is held ON. The p-channel type TFT 608 is turned OFF and the n-channel type TFT 609 is turned OFF. The potential of the input signal IN is maintained at the potential $V_L$ on the low potential side.

As for the operation III for storing the charges, the p-channel type transistor 603 is held OFF and the n-channel type transistor 604 is turned OFF. The p-channel type TFT 608 is held OFF and the n-channel type TFT 609 is held OFF. The potential of the input signal IN is maintained at the potential $V_L$ on the low potential side.

After the charge accumulation period into the second capacitor element 602, a charge accumulation period into the first capacitor element 601 starts. In the charge accumulation period into the first capacitor element 601, an operation I for initialization, an operation II for obtaining the potential difference, and an operation III for storing the charges are conducted as well as shown in FIG. 11B.

As for the operation I for initialization, the p-channel type transistor 603 is turned ON and the n-channel type transistor 604 is turned OFF. Also, the p-channel type TFT 608 is turned ON and the n-channel type TFT 609 is turned ON. The potential of the input signal IN is maintained at the potential $V_H$ on the high potential side.

As for the operation II for acquiring the potential difference, the p-channel type transistor 603 is held ON and the n-channel type transistor 604 is held OFF. The p-channel type TFT 608 is turned OFF and the n-channel type TFT 609 is turned OFF. The potential of the input signal IN is maintained at the potential $V_H$ on the high potential side.

As for the operation III for storing the charges, the p-channel type transistor 603 is turned OFF and the n-channel type transistor 604 is held OFF. The p-channel type TFT 608 is held OFF and the n-channel type TFT 609 is held OFF. The potential of the input signal IN is maintained at the potential $V_H$ on the high potential side.

Note that, charges may be accumulated into either the first capacitor element 601 or the second capacitor element 602 earlier, that is, the charges may be accumulated into the second capacitor element 602 earlier than the first capacitor element 601.

The p-channel type transistor 603 and the n-channel type transistor 604 are turned OFF in the normal operation period.

Figure 12:
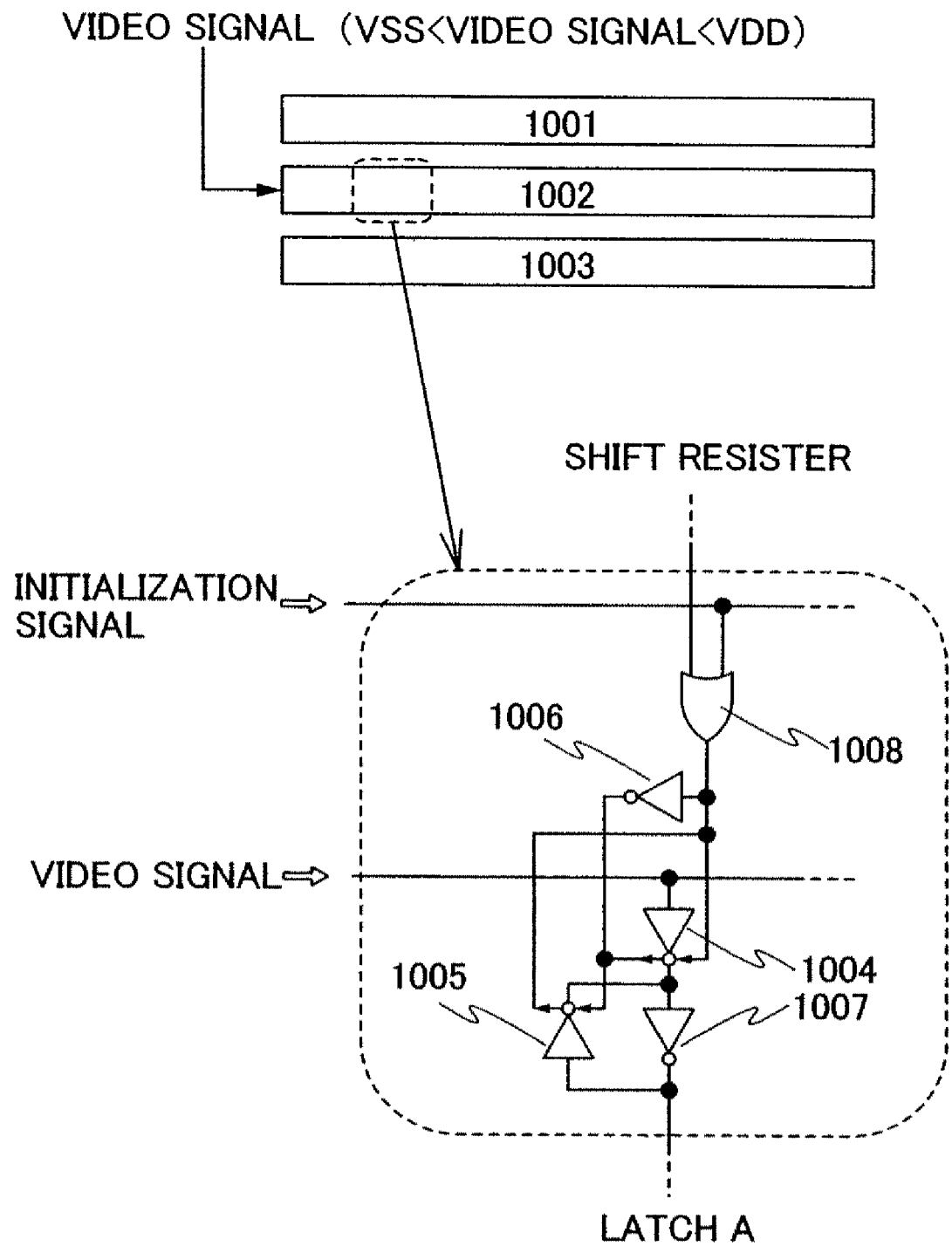
FIG. 12 is a diagram showing a configuration of a signal line driver circuit using the clocked inverter shown in FIG. 11.

The configuration of the signal line driver circuit using a clocked inverter of this embodiment is shown in FIG. 12. The signal line driver circuit of this embodiment includes a shift register 1001, a latch A 1002, and a latch B 1003. The latches A 1002 and B 1003 include a plurality of latches, and the clocked inverter of the invention is used in each of them.

As shown in FIG. 12, specifically, each latch in the latch A 1002 in this embodiment includes a clocked inverter 1004 of the invention, a normal clocked inverter 1005, two inverters 1006 and 1007, and an OR 1008.

It is assumed that the signals having the same amplitude as the power source are inputted to the normal clocked inverter 1005, two inverters 1006 and 1007, and the OR 1008. Therefore, a normal circuit can be applied. However, it is also assumed that the signals having small amplitude are inputted as video signals, that is, the input signals to the clocked inverter 1004. Therefore, the circuit shown in FIG. 11 is required.

Timing signals from the shift register 1001 and initialization signal for controlling the timing for initialization are inputted to the OR 1008.

Concerning the clocked inverter of this embodiment, a video signal corresponds to the input signal IN. Either output signals of the OR 1008 or the signals obtained by inverting the polarity of the output signals of the OR 1008 is inputted to the gate of the p-channel type transistor 608 which is shown in FIG. 11A and the other is inputted to the gate of the n-channel type transistor 609 which is shown in FIG. 11A.

Therefore, when the initialization is to be conducted or the input signals are to be outputted in synchronism with clock signals, the transistors 608 and 609 are to be turned ON. It is to be noted that the signals for controlling A and B in FIG. 11A are required, although they are not shown in FIG. 12. Note that, the initializations shown in I, II, and III in FIG. 11B can be provided in the period when the latch A is not in operation. For instance, they can be provided in a retrace interval or a lighting period (when the driver is not in operation) of the time gradation system, and the like.

Figure 13:
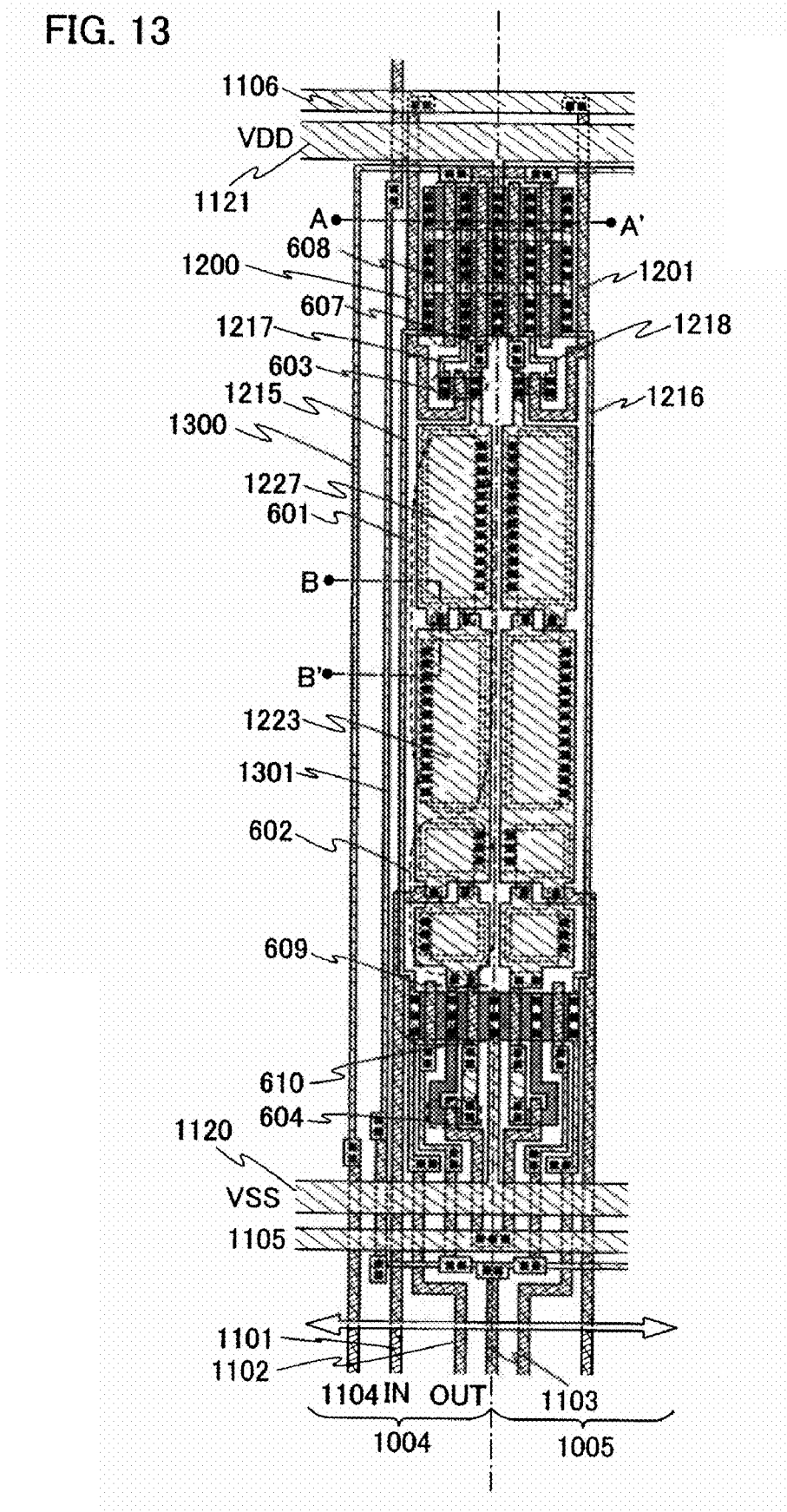
FIG. 13 is a top plan view of the clocked inverter shown in FIG. 11A.

A top view of the clocked inverter 1004 is shown in FIG. 13. The same reference numerals are given to the same components as those described in FIG. 11A.

A wiring 1101 is inputted the input signal IN and a wiring 1102 outputs the output signal OUT. A wiring 1103 is supplied a potential to the gate of the n-channel type transistor 609 and a wiring 1104 is supplied a potential to the gate of the p-channel type transistor 608. A wiring 1105 is supplied a potential to the gate of the n-channel type transistor 604 and a wiring 1106 is supplied a potential to the gate of the p-channel type transistor 603.

Furthermore, a wiring 1120 supplies the power source potential VSS and a wiring 1121 supplies the power source potential VDD.

Figure 14A:
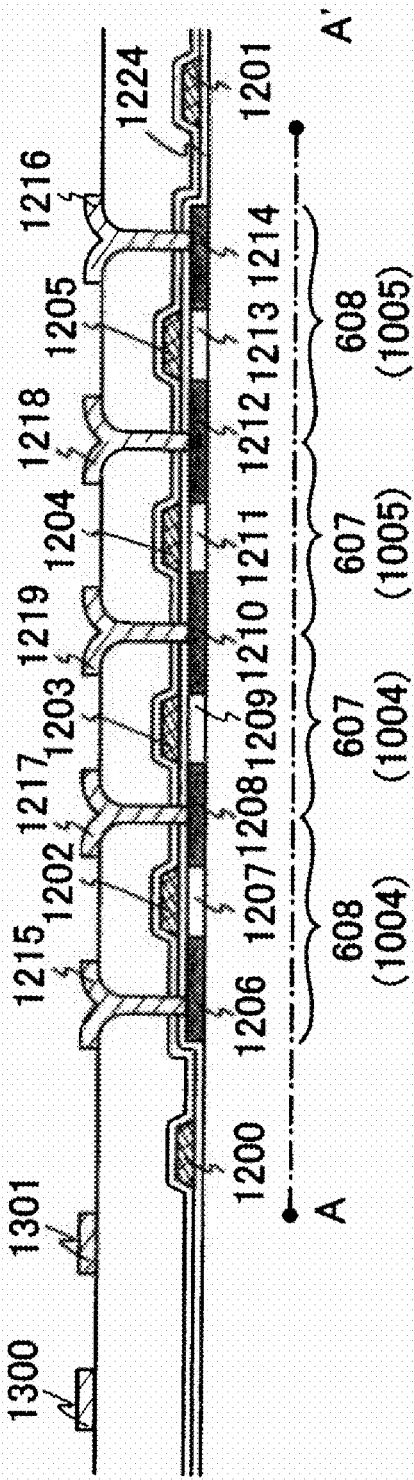
FIGS. 14A and 14B are a cross section view of FIG. 13.
Figure 14B:
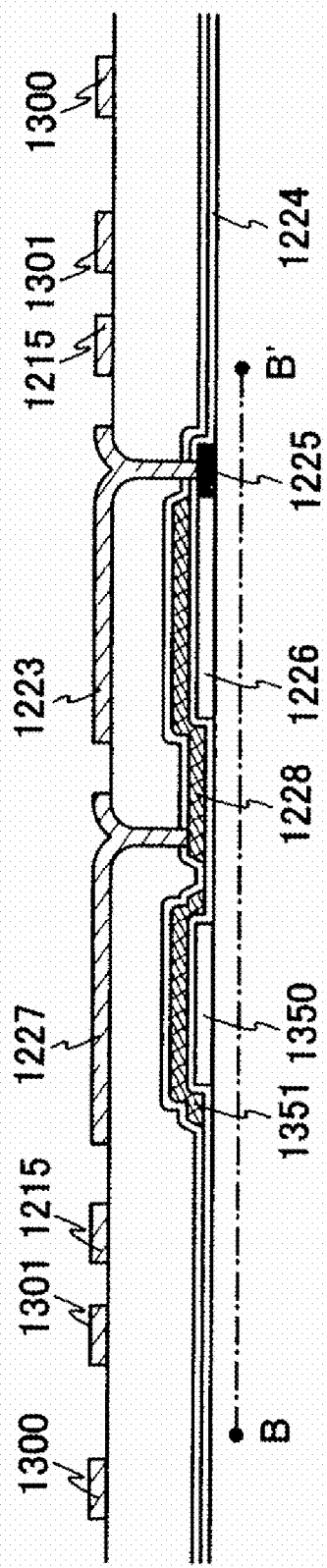

A cross sectional view taken along with a line A-A' in FIG. 13 is shown in FIG. 14A and a cross sectional view taken along with a line B-B' in FIG. 13 is shown in FIG. 14B.

The wirings 1200 and 1201 are both connected to the wiring 1106. A part of the wiring 1200 functions as a gate of the p-channel type transistor 603.

The p-channel type transistor 608 in the clocked inverter 1004 includes a channel forming region 1207, impurity regions 1206 and 1208 which correspond to first or second terminals, a gate electrode 1202 which corresponds to a gate, a gate insulating film 1224 provided between the channel forming region 1207 and the gate electrode 1202.

The p-channel type transistor 607 in the clocked inverter 1004 includes a channel forming region 1209, impurity regions 1208 and 1210 which correspond to first or second terminals, a gate electrode 1203 which corresponds to a gate, a gate insulating film 1224 which is provided between the channel forming region 1209 and the gate electrode 1203.

The p-channel type transistor 607 in the clocked inverter 1005 includes a channel forming region 1211, impurity regions 1210 and 1212 which correspond to first or second terminals, a gate electrode 1204 which corresponds to a gate, a gate insulating film 1224 which is provided between the channel forming region 1211 and the gate electrode 1204.

The p-channel type transistor 608 in the clocked inverter 1005 includes a channel forming region 1213, an impurity regions 1212 and 1214 which correspond to first or second terminals, a gate electrode 1205 which corresponds to a gate, a gate insulating film 1224 which is provided between the channel forming region 1213 and the gate electrode 1205.

The p-channel type transistors 608 and 607 in the clocked inverter 1004 have the impurity region 1208 in common. The impurity region 1208 corresponds to a source in the p-channel type transistor 608 in the clocked inverter 1004 and corresponds to a drain in the p-channel type transistor 607 in the clocked inverter 1004.

The p-channel type transistors 608 and 607 in the clocked inverter 1005 have the impurity region 1212 in common. The impurity region 1212 corresponds to a source in the p-channel type transistor 608 in the clocked inverter 1005 and corresponds to a drain in the p-channel type transistor 607 in the clocked inverter 1005.

The p-channel type transistor 607 in the clocked inverter 1004 and the p-channel type transistor 607 in the clocked inverter 1005 have the impurity region 1210 in common. The impurity region 1210 corresponds to a source in both transistors.

The impurity region 1206 is connected to a wiring 1215. The wiring 1215 is connected to the drain of the n-channel type transistor 609 in the clocked inverter 1004. The impurity region 1214 is connected to a wiring 1216. The wiring 1216 is connected to the drain of the n-channel type transistor 609 in the clocked inverter 1005.

A wiring 1217 which is connected to the impurity region 1208 is connected to the first terminal of the p-channel type transistor 603 in the clocked inverter 1004. The gate electrode 1203 of the p-channel type transistor 607 in the clocked inverter 1004 is connected to the second terminal of the p-channel type transistor 603 in the clocked inverter 1004 electrically.

The impurity region 1212 is connected to a wiring 1218. The impurity region 1210 is connected to a wiring 1219. The wiring 1219 is connected to the wiring 1121.

A wiring 1300 is connected to the gate electrode 1202 and also connected to the wiring 1104 electrically. A wiring 1301 is connected to the wiring 1103 electrically.

A wiring 1223 is connected to an impurity region 1225 in a semiconductor film 1226 of the first capacitor element 601. The semiconductor film 1226 and the capacitor element electrode 1228 of the first capacitor element 601 are overlapped with each other with a gate insulating film 1224 interposed therebetween. The capacitor element electrode 1228 of the first capacitor element 601 is connected to the wiring 1227 and the wiring 1227 is connected to the second terminal of the p-channel type TFT 603. A semiconductor film 1350 of the first capacitor element 601 is not shown, however, it is connected to the wiring 1227 in the impurity region of the semiconductor film 1350. The capacitor element electrode 1351 of the first capacitor element 601 is overlapped with the semiconductor film 1350 with the gate insulating film 1224 interposed therebetween.

A capacitor element formed by overlapping the semiconductor film 1226 and the electrode for the capacitor element 1228 so as to sandwich the gate insulating film 1224 and a capacitor element formed by overlapping the semiconductor film 1350 and the electrode for the capacitor element 1351 with the gate insulating film 1224 interposed therebetween both correspond to the first capacitor element 601.

In this manner, capacitor elements are formed as MOS capacitors. In MOS capacitors, however, the capacitance value becomes quite small depending on the higher and lower relation of the potentials at one electrode and another. Therefore, two capacitor elements are provided and the polarity and the directions of electrodes are inversed so that the capacitor elements can operate regardless of the higher or lower relation of the potentials.

As is confirmed in FIG. 13, capacitor elements are formed rather large. This is because the voltage of the input signal IN is divided into the capacitor element 601 and the gate capacitor of the transistor 607. For example, when the capacitor element 601 and the gate capacitor of the transistor 607 have the same capacitance, only half of the amplitude of the input signal IN is supplied to the gate of the transistor 607. Therefore, the capacitor element 601 is required to be large to receive the half rest. As a standard, it is desirable to form the capacitor element 601 five times as large as the gate capacitor of the transistor 607. It is to be noted that the same can be applied to the relation between the capacitor element 602 and the transistor 610.

It is to be noted that the clocked inverter which is one of the digital circuits of the invention is not exclusively limited to the configuration shown in FIG. 13. For example, it can be applied as a clocked inverter which configures a flip-flop circuit in the shift register 1001. In this case, the shift register does not operate during the retrace period of the inputted video signals. Therefore, the charge is to be initialized and the potential difference which is to be corrected is to be stored during the retrace interval.

Figure 22:
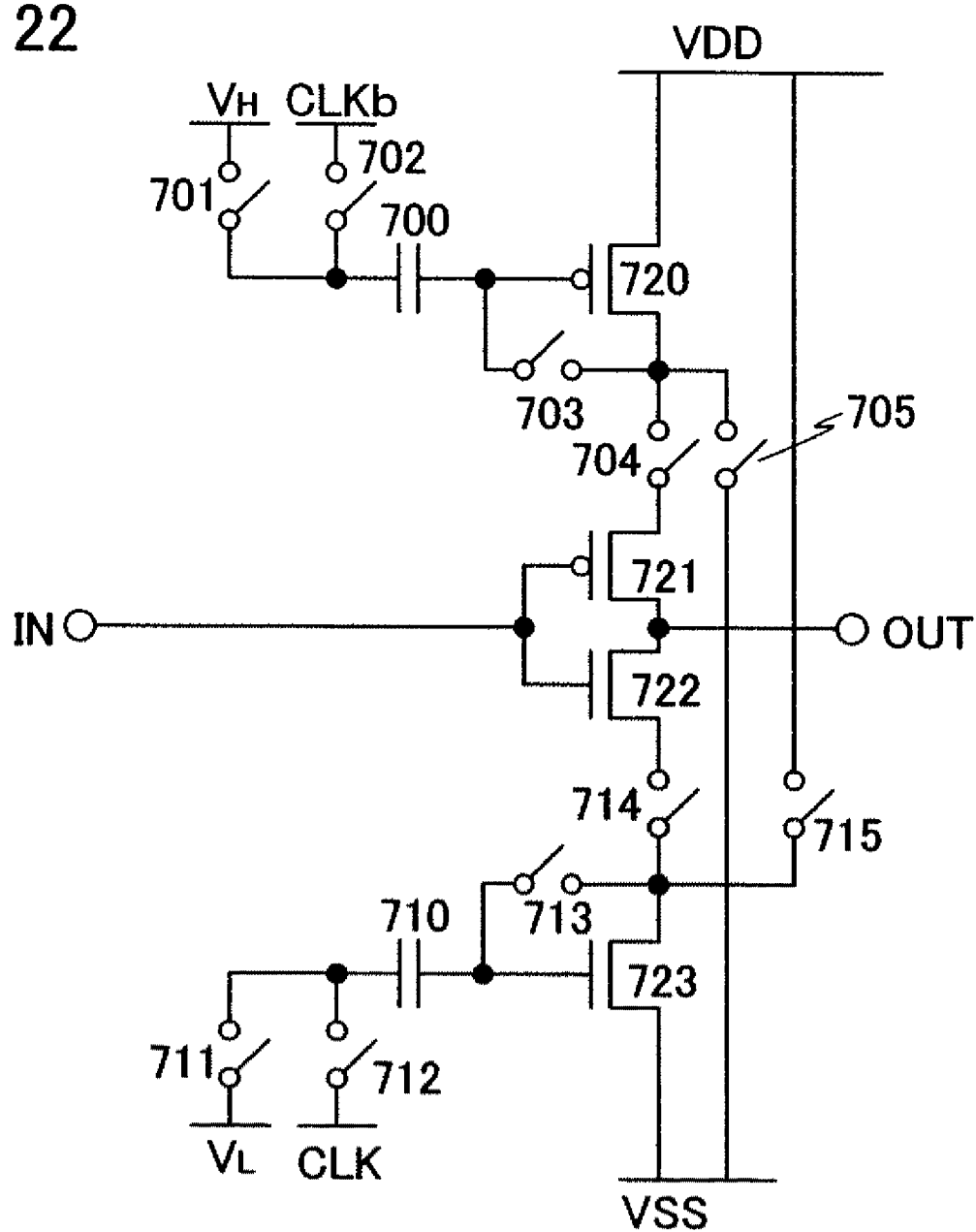
FIG. 22 is a diagram showing a configuration of the clocked inverter of the invention which is applied to a shift register.

A configuration of the clocked inverter of the invention which is used for the shift register is shown in FIG. 22 as an example.

The clocked inverter shown in FIG. 22 includes a first capacitor element 700, switches 701 to 705 for controlling the potential supply to the first capacitor element 700. Moreover, the clocked inverter shown in FIG. 22 includes a second capacitor element 710 and switches 711 to 715 for controlling the potential supply to the second capacitor element 710.

The switch 702 controls the potential supply of inverted clock signals (CLKb) for a first electrode of the capacitor element 700. The switch 701 controls the supply of power source potential on the high potential side $V_H$ for the first electrode of the first capacitor element 700. The switch 703 controls the connection between a gate and a drain of a p-channel type transistor 720 of which gate is connected to a second electrode of the capacitor element 700. The switch 704 controls the connection between a drain of the p-channel type transistor 720 and a source of a p-channel type transistor 721. The switch 705 controls the supply of the potential VSS for the drain of the p-channel type transistor 720.

The switch 712 controls the potential supply of clock signals (CLK) for a first electrode of the second capacitor element 710. The switch 711 controls the supply of a power source potential on the low potential side $V_L$ for the first electrode of the second capacitor element 710. The switch 713 controls the connection between a gate and a drain of an n-channel type transistor 723 of which a gate is connected to a second electrode of the second capacitor element 710. The switch 714 controls the connection between the drain of the n-channel type transistor 723 and a source of the n-channel type transistor 722. The switch 715 controls the supply of the potential VDD for the drain of the n-channel type transistor 723.

In this embodiment, the switch 705 controls the supply of the potential VSS for the drain of the p-channel type transistor 720, however, the invention is not exclusively limited to this configuration. The switch 705 may supply a different potential from the potential VSS (for example, a potential VSS') to the drain of the p-channel type transistor 720. Also in this embodiment, the switch 715 controls the supply of the potential VDD for the drain of the n-channel type transistor 723, however, the invention is not exclusively limited to this configuration. The switch 715 may supply a different potential from the potential VDD (for example, a potential VDD') to the drain of the n-channel type transistor 723. It is to be noted in these cases that the potential VDD' is higher than the potential VSS' (VDD'>VSS').

A source electrode of the p-channel type TFT 720 in the clocked inverter of the invention receives the power source potential VDD. A source electrode of the n-channel type TFT 723 in the clocked inverter of the invention receives the power source potential VSS. Furthermore, the drains of the p-channel type TFT 721 and the n-channel type TFT 722 in the clocked inverter of the invention are connected to each other, and the potential of the node is supplied to the subsequent circuit as a potential of the output signal OUT.

The second electrode of the first capacitor element 700 is connected to the gate of the p-channel type transistor 720, and the second electrode of the second capacitor element 710 is connected to the gate of the n-channel type transistor 723.

In the clocked inverter shown in FIG. 22, the charges held in the first capacitor element 700 and the second capacitor element 710 are initialized by turning ON the switches 701, 703, 705, 711, 713 and 715, and turning OFF the switches 702, 704, 712 and 714. Furthermore, the potential difference which is to be corrected is stored in the first capacitor element 700 and the second capacitor element 710 by turning ON the switches 701, 703, 711 and 713, and turning OFF the switches 702, 704, 705, 712, 714 and 715. The normal operation as a primary function of a digital circuit can be performed by turning ON the switches 702, 704, 712 and 714, and turning OFF the switches 701, 703, 705, 711, 713 and 715.

Note that, in the clocked inverter shown in FIG. 22, the power source potential on the high potential side $V_H$ does not necessarily have to be supplied to the first electrode of the first capacitor element 700. The power source potential on the low potential side $V_L$ does not necessarily have to be supplied to the first electrode of the second capacitor element 710. In this case, initialization of the charge and the operation for storing the potential difference which is to be corrected are performed by turns in the first capacitor element 700 and the second capacitor element 710.

It is to be noted that one of the merits of the invention is that the transistors configuring the circuit element can be turned ON/OFF accurately even when the amplitude of signals to be inputted to the gates of the transistors configuring the circuit element (in this embodiment, the p-channel type transistor 720 and the n-channel type transistor 723) are smaller than that of the power source voltage (the difference between the power source potentials on the high potential side and the low potential side). However, when the supply of the potential VSS for the drain of the p-channel type transistor of which circuit element is configured with switches (the p-channel type transistor 720 in this embodiment) can be controlled and the supply of the potential VDD for the drain of the n-channel type transistor of which circuit element is configured by switches (the n-channel type transistor 723 in this embodiment) can be controlled, capacitor elements of the correcting units (the first capacitor element 700 and the second capacitor element 710 in the embodiment) can be charged so that the DC level of the signals (clock signals in this embodiment) to be inputted to the gate of the transistor which configures the circuit element can be corrected to speed up the operation of the transistors configuring the circuit element (the p-channel type transistor 720 and the n-channel type transistor 723 in this embodiment). That is, in the case of the present embodiment, even when the power source voltage is not large enough for the absolute value of the threshold voltage of the transistor which configures the circuit element, operation speed of the transistor can be improved. Therefore, it is another merit of the invention that the power consumption can be reduced by decreasing the power source voltage without decreasing the operation speed.

Embodiment 2

All semiconductor devices using a digital circuit of the invention to the driver circuit fall within a category of the invention. An outline view of a semiconductor display device which is one of the semiconductor devices of the invention is shown in FIG. 15. The semiconductor display device shown in FIG. 15 includes a pixel portion 1503 on which a plurality of pixels are provided, a scanning line driver circuit 1501 which selects pixels, and a signal line driver circuit 1502 which supplies video signals to the selected pixels. Furthermore, various types of signals and power source potential to be utilized in driving the pixel portion 1503, the signal line driver circuit 1502 and the scanning line driver circuit 1501 are supplied through an FPC 1504.

The semiconductor display device of the invention includes a liquid crystal display device, a light emitting device which has a light emitting element in each pixel represented by an organic light emitting element in each pixel, a DMD (Digital Micromirror Device), a PDP (Plasma Display Panel), an FED (Field Emission Display) and the like, and the other display devices which have circuit elements formed by using semiconductor films in driver circuits.

Besides the semiconductor display device, semiconductor devices which fall within a category of the invention include a semiconductor integrated circuit which has one or a plurality of the following circuits: an arithmetic circuit including an adder, an ALU (Arithmetic Logic Circuit), a counter, a multiplier, a shifter and the like, a memory circuit including a flip-flop, a multiport RAM, an FIFO (First In First Out) circuit and the like, a control circuit including PLA (Programmable Logic Array), and the like.

Embodiment 3

Electronic apparatuses, each using a semiconductor device according to the present invention, include a video camera, a digital camera, a goggle type display (head mounted display), a navigation system, a sound reproduction device (a car audio equipment and an audio set), a note-size personal computer, a game machine, a portable information device (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like.

What is claimed is:

1. A semiconductor device comprising:
a transistor;
a capacitor element;
a first switch;
a second switch; and
a third switch,
wherein a first electrode of the capacitor element is electrically connected to a gate of the transistor,
wherein a first terminal of the first switch is electrically connected to the gate of the transistor, and a second terminal of the first switch is electrically connected to one of a source and a drain of the transistor,
wherein a first terminal of the second switch is electrically connected to the one of the source and the drain of the transistor,
wherein a first terminal of the third switch is electrically connected to a second electrode of the capacitor element, and
wherein an area of the first electrode of the capacitor element is larger than an area of a channel region of the transistor.

2. The semiconductor device according to claim 1, wherein a source of the transistor is electrically connected to a power supply line.

3. The semiconductor device according to claim 1, wherein the transistor is an amorphous silicon transistor.

4. The semiconductor device according to claim 1, wherein the transistor is a polycrystalline silicon transistor.

5. The semiconductor device according to claim 1, wherein a video signal is supplied to the second electrode of the capacitor element through the third switch.

6. The semiconductor device according to claim 1, wherein a digital signal is supplied to the second electrode of the capacitor element through the third switch.

7. The semiconductor device according to claim 1, wherein the transistor, the capacitor element, the first switch and the second switch are provided in a driver circuit.

8. The semiconductor device according to claim 1, wherein the semiconductor device is a light emitting device.

9. A semiconductor device comprising:
a transistor;
a capacitor element;
a first switch;
a second switch; and
a third switch; and
wherein a first terminal of the first switch is electrically connected to a first electrode of the capacitor element,
wherein a first terminal of the second switch is electrically connected to the first electrode of the capacitor element,
wherein a second electrode of the capacitor element is electrically connected to a gate of the transistor,
wherein a first terminal of the third switch is electrically connected to the gate of the transistor, and a second terminal of the third switch is electrically connected to one of a source and a drain of the transistor, and
wherein an area of the first electrode of the capacitor element is larger than an area of a channel region of the transistor.

10. The semiconductor device according to claim 9, wherein a source of the transistor is electrically connected to a power supply line.

11. The semiconductor device according to claim 9, wherein the transistor is an amorphous silicon transistor.

12. The semiconductor device according to claim 9, wherein the transistor is a polycrystalline silicon transistor.

13. The semiconductor device according to claim 9, wherein a video signal is supplied to the first electrode of the capacitor element through the first switch.

14. The semiconductor device according to claim 9, wherein a digital signal is supplied to the first electrode of the capacitor element through the first switch.

15. The semiconductor device according to claim 9, wherein the transistor, the capacitor element, the first switch, the second switch and the third switch are provided in a driver circuit.

16. The semiconductor device according to claim 9, wherein the semiconductor device is a light emitting device.

17. A semiconductor device comprising:
a signal line; and
a plurality of circuits, each of the plurality of circuits comprising a capacitor element electrically connected to the signal line, a transistor and a switch,
wherein a first electrode of the capacitor element is electrically connected to the signal line without connecting a transistor between the first electrode of the capacitor element and the signal line, a second electrode of the capacitor element is electrically connected to a gate of the transistor and a first terminal of the switch, a second terminal of the switch is electrically connected to one of a source and a drain of the transistor, and the other of the source and the drain of the transistor is electrically connected to a wiring.

18. The semiconductor device according to claim 17, wherein the wiring is a power supply line.

19. The semiconductor device according to claim 17, wherein a video signal is supplied to the signal line.

20. The semiconductor device according to claim 17, wherein a digital signal is supplied to the signal line.

21. The semiconductor device according to claim 17, wherein the transistor is an n-channel type transistor.

22. The semiconductor device according to claim 17, wherein the transistor is an amorphous silicon transistor.

23. The semiconductor device according to claim 17, wherein the transistor is a polycrystalline silicon transistor.

24. The semiconductor device according to claim 17, wherein the signal line and the plurality of circuits are provided in a driver circuit.

25. The semiconductor device according to claim 17, wherein the semiconductor device is a light emitting device.

* * * * *